(12) United States Patent
Wildeson et al.

(10) Patent No.: US 11,081,622 B2
(45) Date of Patent: *Aug. 3, 2021

(54) III-NITRIDE MULTI-WAVELENGTH LED FOR VISIBLE LIGHT COMMUNICATION

(71) Applicant: Lumileds LLC, San Jose, CA (US)

(72) Inventors: Isaac Harshman Wildeson, San Jose, CA (US); Parijat Pramil Deb, San Jose, CA (US); Robert Armitage, Cupertino, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/010,300

(22) Filed: Sep. 2, 2020

(65) Prior Publication Data
US 2020/0411720 A1 Dec. 31, 2020

Related U.S. Application Data

(63) Continuation of application No. 16/228,311, filed on Dec. 20, 2018, now Pat. No. 10,804,429.
(Continued)

(30) Foreign Application Priority Data

Mar. 22, 2018 (EP) .................................... 18163287
Mar. 26, 2018 (EP) .................................... 18163994

(51) Int. Cl.
*H04B 10/00* (2013.01)
*H01L 33/06* (2010.01)
(Continued)

(52) U.S. Cl.
CPC ............ *H01L 33/06* (2013.01); *H01L 27/153* (2013.01); *H01L 27/156* (2013.01);
(Continued)

(58) Field of Classification Search
CPC combination set(s) only.
See application file for complete search history.

(56) References Cited

U.S. PATENT DOCUMENTS 5,283,447 A * 2/1994 Olbright ............. H01S 5/04256
257/85
5,952,681 A * 9/1999 Chen ..................... H01L 27/153
257/88
(Continued)

FOREIGN PATENT DOCUMENTS

CN 107068811 A 8/2017
DE 102010002966 A1 9/2011
(Continued)

OTHER PUBLICATIONS

"IEEE 802.15.7-2011—IEEE Standard for Local and Metropolitan Area Networks—Part 15.7: Short-Range Wireless Optical Communication Using Visible Light (2011)".
(Continued)

*Primary Examiner* — Agustin Bello
(74) *Attorney, Agent, or Firm* — Servilla Whitney LLC

(57) ABSTRACT

A light emitting diode (LED) array may include a first pixel and a second pixel on a substrate. The first pixel and the second pixel may include one or more tunnel junctions on one or more LEDs. The LED array may include a first trench between the first pixel and the second pixel. The trench may extend to the substrate.

20 Claims, 20 Drawing Sheets

Related U.S. Application Data

(60) Provisional application No. 62/609,447, filed on Dec. 22, 2017, provisional application No. 62/609,359, filed on Dec. 22, 2017.

(51) Int. Cl.

| | |
|---|---|
| *H01L 33/00* | (2010.01) |
| *H01L 27/15* | (2006.01) |
| *H01L 33/62* | (2010.01) |
| *H01L 33/50* | (2010.01) |
| *H01L 33/32* | (2010.01) |
| *H05B 45/20* | (2020.01) |
| *H05B 47/19* | (2020.01) |
| *H01L 31/167* | (2006.01) |
| *H01L 33/38* | (2010.01) |
| *H04B 10/116* | (2013.01) |
| *H04B 10/572* | (2013.01) |
| *H01L 33/08* | (2010.01) |
| *H01L 31/02* | (2006.01) |
| *H01L 31/0232* | (2014.01) |

(52) U.S. Cl.
CPC .......... *H01L 31/167* (2013.01); *H01L 33/007* (2013.01); *H01L 33/0075* (2013.01); *H01L 33/32* (2013.01); *H01L 33/38* (2013.01); *H01L 33/50* (2013.01); *H01L 33/62* (2013.01); *H04B 10/116* (2013.01); *H04B 10/572* (2013.01); *H05B 45/20* (2020.01); *H05B 47/19* (2020.01); *H01L 31/02019* (2013.01); *H01L 31/02327* (2013.01); *H01L 33/08* (2013.01); *H01L 2933/0016* (2013.01)

(56) References Cited

U.S. PATENT DOCUMENTS

| | | | |
|---|---|---|---|
| 7,692,202 B2 | 4/2010 | Bensch | |
| 8,022,421 B2 | 9/2011 | Hsueh et al. | |
| 8,058,663 B2* | 11/2011 | Fan | H01L 27/15 257/98 |
| 8,114,691 B2 | 2/2012 | Lee et al. | |
| 8,604,498 B2* | 12/2013 | Huang | H01L 33/62 257/98 |
| 8,654,802 B2* | 2/2014 | Kumei | H01S 5/04257 372/27 |
| 9,029,175 B2* | 5/2015 | Huang | H01L 33/502 438/29 |
| 9,130,353 B2 | 9/2015 | Lell et al. | |
| 9,246,050 B2 | 1/2016 | Cha et al. | |
| 9,419,031 B1 | 8/2016 | Or-Bach et al. | |
| 9,537,050 B2* | 1/2017 | Gilet | H01L 33/20 |
| 9,876,141 B2 | 1/2018 | Lopez | |
| 10,002,928 B1* | 6/2018 | Raring | H01L 33/0075 |
| 10,050,080 B2* | 8/2018 | Gilet | H01L 33/32 |
| 10,090,437 B2 | 10/2018 | Timmering et al. | |
| 10,103,195 B2* | 10/2018 | Damilano | H01L 33/32 |
| 10,249,800 B1* | 4/2019 | Lamkin | H01L 33/42 |
| 10,355,168 B2 | 7/2019 | Lopez | |
| 2002/0187568 A1 | 12/2002 | Stockman | |
| 2007/0158659 A1* | 7/2007 | Bensce | H01L 31/11 257/79 |
| 2007/0170444 A1 | 7/2007 | Cao | |
| 2008/0251799 A1 | 10/2008 | Kazuhiro | |
| 2009/0078955 A1* | 3/2009 | Fan | H01L 27/15 257/98 |
| 2009/0090932 A1* | 4/2009 | Bour | H01S 5/183 257/103 |
| 2010/0117997 A1* | 5/2010 | Haase | H01L 27/124 345/204 |
| 2011/0027925 A1* | 2/2011 | Ikuta | H01S 5/18311 438/31 |
| 2011/0163223 A1* | 7/2011 | Guidash | H01L 27/1464 250/208.1 |
| 2011/0233575 A1* | 9/2011 | Huang | H01L 33/62 257/89 |
| 2011/0256648 A1* | 10/2011 | Kelley | H01L 33/08 438/29 |
| 2012/0135557 A1 | 5/2012 | Okuno | |
| 2012/0276722 A1 | 11/2012 | Chyi et al. | |
| 2013/0022063 A1* | 1/2013 | Kumei | H01S 5/18355 372/24 |
| 2013/0069191 A1* | 3/2013 | Or-Bach | H01L 31/1892 257/432 |
| 2013/0193308 A1* | 8/2013 | Cellek | H01L 31/1013 250/208.1 |
| 2013/0193448 A1 | 8/2013 | Chou et al. | |
| 2014/0065740 A1* | 3/2014 | Huang | H01L 33/62 438/27 |
| 2014/0191243 A1 | 7/2014 | Singh et al. | |
| 2015/0024524 A1* | 1/2015 | Yao | H01L 33/0075 438/26 |
| 2015/0093121 A1* | 4/2015 | Matsuda | H01S 5/124 398/188 |
| 2015/0115290 A1* | 4/2015 | Guenard | H01L 33/0075 257/79 |
| 2016/0197151 A1* | 7/2016 | Han | H01L 31/0735 257/76 |
| 2017/0025567 A1* | 1/2017 | Lu | H01L 27/153 |
| 2017/0098746 A1* | 4/2017 | Bergmann | H01L 33/60 |
| 2017/0181241 A1 | 6/2017 | Hoe | |
| 2017/0213868 A1 | 7/2017 | Damilano et al. | |
| 2017/0264080 A1 | 9/2017 | Lell et al. | |
| 2017/0323788 A1* | 11/2017 | Mi | H01L 33/002 |
| 2017/0338373 A1* | 11/2017 | Wildeson | H01L 33/0075 |
| 2018/0012929 A1* | 1/2018 | Lu | H01L 27/153 |
| 2018/0019359 A1* | 1/2018 | Kayes | H01L 31/0735 |
| 2018/0104130 A1 | 4/2018 | Sampson et al. | |
| 2018/0269352 A1* | 9/2018 | Tian | H01L 33/0095 |
| 2019/0006821 A1* | 1/2019 | Tang | H01L 33/08 |
| 2019/0052061 A1* | 2/2019 | Kondo | G03G 15/04072 |
| 2019/0074404 A1* | 3/2019 | Young | H01L 33/06 |
| 2019/0198561 A1* | 6/2019 | Wildeson | H01L 33/007 |
| 2019/0198709 A1* | 6/2019 | Wildeson | H01L 27/156 |
| 2019/0229234 A1 | 7/2019 | Zou et al. | |
| 2019/0279558 A1 | 9/2019 | Monestier et al. | |

FOREIGN PATENT DOCUMENTS

| | | |
|---|---|---|
| WO | 2005073485 A2 | 8/2005 |
| WO | 2012077884 A1 | 6/2012 |
| WO | 2017067333 A1 | 4/2017 |

OTHER PUBLICATIONS

Non-Final Office Action in U.S. Appl. No. 16/228,211, dated Apr. 15, 2020, 17 pages.

"TracePro's accurate LED source modeling improves the performance of optical design simulations.", Lambda Research Corporation, Technical Article, Mar. 2015, 13 pages.

Chang, et al., "Cascaded GaN Light-Emitting Diodes with Hybrid Tunnel Junction Layers", IEEE Journal of Quantum Electronics, vol. 51, No. 8, pp. 1-5, Art No. 3300505 (Aug. 2015).

El-Ghoroury, "Growth of monolithic full-color GaN-based LED with intermediate carrier blocking layers", AIP Advances 6, 075316 (2016).

Liu, Zongyuan, et al., "Precise optical modeling of blue light-emitting diodes by Monte Carlo ray-tracing", Optics Express, Apr. 26, 2010, vol. 18, No. 9, pp. 9398-9412.

Okumura, et al., "Backward diodes using heavily Mg-doped GaN growth by ammonia molecular-beam epitaxy", Appl. Phys. Lett. 108, 072102 (2016).

Schubert, "Interband tunnel junctions for wurtzite III-nitride semiconductors based on heterointerface polarization charages", Phys. Rev. B 81, 035303 (2010).

(56) References Cited

OTHER PUBLICATIONS

PCT International Search Report and Written Opinion in PCT/US2020/060961 dated Mar. 4, 2021, 11 pages.

* cited by examiner

III-NITRIDE MULTI-WAVELENGTH LED FOR VISIBLE LIGHT COMMUNICATION

CROSS REFERENCE TO RELATED APPLICATIONS

This application is a Continuation of U.S. application Ser. No. 16/228,311, filed on Dec. 20, 2018, which claims the benefit of U.S. Provisional Application No. 62/609,447 filed on Dec. 22, 2017, U.S. Provisional Application No. 62/609,359 filed on Dec. 22, 2017, European Patent Application No. 18163287.8 filed on Mar. 22, 2018, and European Patent Application No. 18163994.9 filed on Mar. 26, 2018, the contents of which are hereby incorporated by reference herein.

BACKGROUND

Micro-LEDs (uLEDs) may be small size LEDs (typically ~50 um in diameter or smaller) that can be used to produce very high-resolution color displays when uLEDs of red, blue and green wavelengths may be aligned in close proximity. Manufacture of an uLED display typically involves picking singulated uLEDs from separate blue, green and red WL wafers and aligning them in alternating close proximity on the display. Due to the small size of each uLED, this picking, aligning, and attaching assembly sequence is slow and failure prone. Even worse, since improving resolution generally requires decreasing uLED size, the intricacy and difficulty in pick and place operations needed to populate a high resolution uLED display can make them too expensive for widespread use.

SUMMARY

A light emitting diode (LED) array may include a first pixel and a second pixel on a substrate. The first pixel and the second pixel may include one or more tunnel junctions on one or more LEDs. The LED array may include a first trench between the first pixel and the second pixel. The trench may extend to the substrate.

BRIEF DESCRIPTION OF THE DRAWINGS

A more detailed understanding can be had from the following description, given by way of example in conjunction with the accompanying drawings wherein.

DETAILED DESCRIPTION OF THE PREFERRED EMBODIMENTS

Figure 1A:
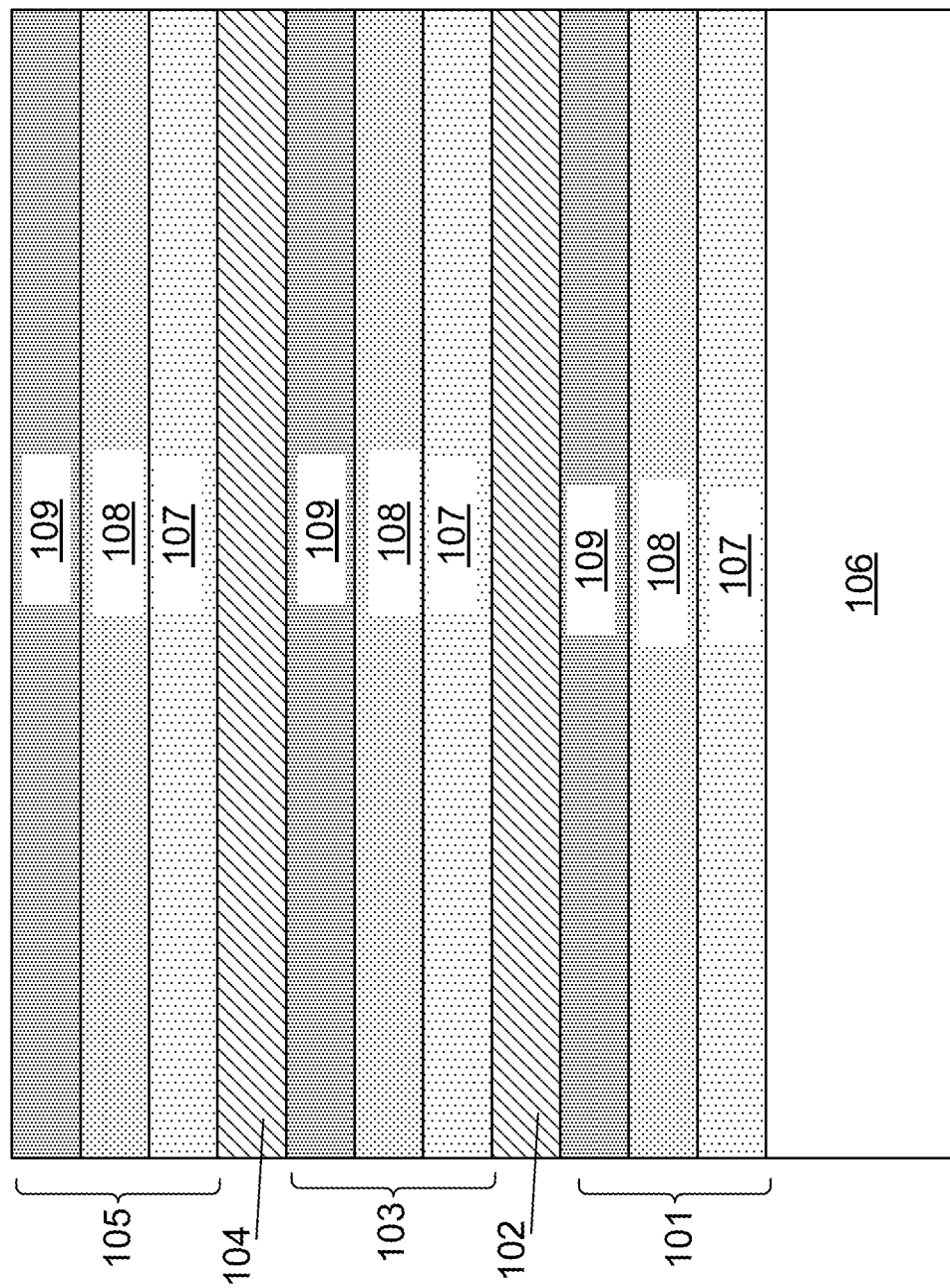
FIG. 1A shows a multiple quantum well light emitting diode (LED)

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available. These devices may include light emitting diodes, resonant cavity light emitting diodes, vertical cavity laser diodes, edge emitting lasers, or the like (hereinafter referred to as "LEDs"). Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

The present disclosure generally relates manufacture of micro light emitting diode (uLED) displays and of multi-wavelength light emitters with large bandwidth for free-space visible light communications. Epitaxial tunnel junctions may be used to combine multiple emission wavelengths within a single LED device Manufacturing uLEDs could be simplified if two or more active regions emitting different wavelengths may be integrated within a single wafer. Such an approach may be possible within the AlInGaN materials system since it has been demonstrated that blue, green and red LEDs can be all made in this system. However, use of a multi-color chip in a uLED display requires not only stacking multiple layers able to emit at different wavelengths within a single epitaxial growth run, but also requires an ability to change respective emission intensity ratios between the emitters of different wavelengths.

One possible way to make a multicolor uLED chip may be to form multiple quantum wells (MQW) able to emit red, green, and blue light within a single active region, i.e. between the p- and n-layers of one p-n junction. With an optimized growth order of the multiple quantum wells, an LED with one predominant color that can be changed depending on the driving current, e.g., it may appear predominantly red at low current, predominantly green at intermediate current, and predominantly blue at high current. However, this type of color control mechanism makes it difficult to adjust the surface radiance and dominant wavelength of the LED independently of each other, and consequent color purity can be poor.

As an alternative, two or more pixels of different wavelengths in the same device footprint can be formed by growing an LED of several p-n junctions within the same epitaxial wafer. A multi-level mesa etching procedure can be executed to make independent electrical contacts to each of the p-n junctions. One or more emitter layers of different wavelengths can be embedded in separate p-n junctions with separate current paths so the wavelength and radiance can be controlled independently. Unfortunately, given current post-epitaxial device processing limitations it may be difficult to manufacture such multiple wavelength uLEDs. Dry etching may be usually needed to open vias for contacting buried layers. The dry etch process introduces atomic-level damage to the crystal that changes its conductivity type from p-type to n-type. Due to this conductivity type conversion it may not be possible to obtain an ohmic contact of low resistance to a buried p-type nitride surface that has been exposed by dry etching. In effect, creating a non-ohmic contact to an etched p-GaN surface can result in a forward voltage penalty of one volt or more for some of the active regions. Such a large forward voltage may not be considered practical with respect to the power consumption requirements of micro-displays.

In accordance with other embodiments of the invention, a multiple quantum well LED suitable for wafer-scale uLEDs can include a first LED including a group of quantum wells able to emit light of a first wavelength. A second LED including a group of quantum wells may also be formed, with the second LED able to emit light of a second wavelength distinct from the wavelength emitted by the first LED. A tunnel junction layer may be formed to separate the first and second LEDs. The quantum wells in the LEDs may be caused to emit light injecting current from independent electrical contacts that extend to each of the first and second LEDs. In some embodiments, three or more LEDs can be defined to allow for RGB uLEDs.

In another embodiment, a method of manufacturing a multiple quantum well LED includes forming a first LED including a group of quantum wells on a substrate. A tunnel junction layer may be formed on the first LED, and a second LED may be formed on the tunnel junction layer. At least one channel with sidewalls may be etched through the first LED to define at least two light emission regions in the multiple quantum well LED. Metal contacts can be applied to provide independent electrical contacts to each of the first and second groups of quantum wells. The p-GaN layers can be activated, at least in part, after an anneal promoting hydrogen diffusion through the sidewall of an etch channel. In some embodiments, the channel with sidewalls may be etched through to the substrate, while in other embodiments etching only proceeds to a n-GaN layer positioned on the substrate.

FIG. 1A illustrates multiple LEDs formed on a substrate that may be used to form an LED. The LED may have multiple quantum wells, multiple defined channels separating the LED into different pixels, and/or discrete wavelength emitter sites for visual light communication (VLC). The uLED device may include a mesa structure and independent electrical contacts.

In the following description, it will be understood that the terms light emission, color, red/green/blue, and RGB may include any light mostly composed of, centered upon, or predominantly having a specified wavelength. In some embodiments, light emission may also include non-visible light, including near IR and UV light. In other embodiments, multiple quantum wells can support closely matched but still distinct emission wavelengths (e.g., independently modulated dual blue emitters having respective 430 nm and 460 nm peak wavelengths).

Referring now to FIG. 1A, a multiple quantum well LED may include a substrate 106 which may be formed from patterned or unpatterned sapphire. In some embodiments the substrate 106 may be polished and used to form at least a portion of a display. The substrate 106 may support light emitting LEDs that can include multiple p and n-layers sandwiching one or more groups of quantum wells, with at least some of the quantum wells forming active regions capable of light emission. For example, the substrate 106 may support a first group of quantum wells positioned between n-GaN and p-GaN layers to form a first LED 101 able to emit light of a first wavelength (e.g., blue). A second group of quantum wells may be positioned between n-GaN and p-GaN layers to form a second LED 103 able to emit light of a second wavelength (e.g., green) distinct from the first wavelength, with a first tunnel junction 102 separating the first LED 101 and the second LED 103. A second tunnel junction layer 104 may be formed on the second LED 103 and a third group of quantum wells may be positioned between n-GaN and p-GaN layers to form a third LED 105 able to emit light of a third wavelength (e.g., red) distinct from the first and second wavelengths. As described below, independent electrical contacts may be formed as contact pairs to provide sufficient voltage and current to induce light emission from each of the first LED 101, the second LED 103, and the third LED 105 from a suitable printed circuit board. In some embodiments, each of the first LED 101, the second LED 103, and the third LED 105 may be independently voltage biased.

Advantageously, as compared to a uLED display made from conventional single-wavelength uLEDs, the number of epitaxial growth runs required to produce source die for uLED displays may be reduced to one third (or one half if stacking only two wavelengths) of the number or runs required with existing methods, reducing cost and improving throughput at the epi manufacturing stage. In addition, the number of pick and place operations required to populate a display may be halved or cut to a third, since two or three pixels may be transferable in each pick and place operation.

For even more efficient manufacture, in wafer scale embodiments that allow for all required wavelengths to be efficiently grown on one epi wafer, there may be no required pick and place. The display uLEDs can remain on a continuous polished sapphire support/substrate that can form a part of the packaging of the uLED display.

As another advantage, since all contacts to buried layers can be made to n-GaN surfaces, the disclosed structures and methods avoid problems associated with making an ohmic electrical contact to etched p-GaN surfaces, making possible lower operating voltage and higher wall-plug efficiency. The number of etching steps to make all necessary electrical contacts may be also reduced, and restrictions on control of the etching rate may be relaxed since all etched contacts in the tunnel junction invention may be made to thick n-GaN layers (versus generally thinner p-GaN layers), even while maintaining high LED efficiency.

As seen in FIG. 1A, multiple LEDs of quantum wells capable of light emission of various wavelengths may be formed on a substrate 106. The substrate 106 may be capable of supporting epitaxial III-nitride film growth. The substrate 106 may compose, for example, sapphire, patterned sapphire, or silicon carbide. A first LED 101 may be formed on the substrate 106. The first LED may compose any Group III-V semiconductors, including binary, ternary, and quaternary alloys of gallium, aluminum, indium, and nitrogen, also referred to as III-nitride materials. In an example, the first LED 101 may compose GaN. The first LED 101 may be formed using conventional deposition techniques, such as metal-organic chemical vapor deposition (MOCVD), molecular beam epitaxy (MBE), or other epitaxial techniques. In an epitaxial deposition process, chemical reactants provided by one or more source gases may be controlled and the system parameters may be set so that depositing atoms arrive at a deposition surface with sufficient energy to move around on the surface and orient themselves to the crystal arrangement of the atoms of the deposition surface. Accordingly, the first LED 101 may be grown on the substrate 106 using conventional epitaxial techniques.

The first LED 101 may be formed from any applicable material to emit photons when excited. More specifically the first LED 101 may be formed from III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof.

The first LED 101 may include a first semiconductor layer 107, an active region 108 on the first semiconductor layer 107, and a second semiconductor layer 109 on the active region 108. The first semiconductor layer 107 may be an n-type layer and one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. The active region 108 may be between the first semiconductor layer 107 and the second semiconductor layer 109 and may receive a current such that the active region 108 emits light beams. The second semiconductor layer 109 may be a p-type layer and may include multiple layers of different composition, thickness, and dopant concentrations, including layers that may not be intentionally doped, or n-type layers. An electrical current may be caused to flow through the p-n junction (e.g., via contacts) in the active region 108 and the active region 108 may generate light of a first wavelength determined at least in part by the bandgap energy of the materials. The first LED 101 may include one more quantum wells.

A first tunnel junction 102 may be formed on the first LED 101. The first tunnel junction 102 may be a barrier layer, such as a thin insulating layer or electric potential. The first tunnel junction may be between two electrically conducting materials. Electrons (or quasiparticles) may pass through the first tunnel junction 102 by the process of quantum tunneling. The first tunnel junction 102 may be formed using conventional deposition techniques, such as MOCVD), MBE, or other epitaxial techniques.

A second LED 103 may be formed on the first tunnel junction 102. The second LED 103 may be similar to the first LED 101 and may be composed of similar layers. The second LED 103 may be formed using similar techniques as those described above with reference to the first LED 101.

A second tunnel junction 104 may be formed on the second LED 103. The second tunnel junction 104 may be similar to the first tunnel junction and may be composed of similar layers. The second tunnel junction 104 may be formed using similar techniques as those described above with reference to the first tunnel junction 102.

A third LED 105 may be formed on the second tunnel junction 104. The third LED 105 may be similar to the first LED 101 and may be composed of similar layers. The third LED 105 may be formed using similar techniques as those described above with reference to the first LED 101.

The first semiconductor layer 107, the active region 108, and the third semiconductor layer 109 of each LED may be composed of different materials, such that one or more of the first LED 101, the second LED 103, and the third LED 105 emit a light of a different wavelength. For example, the first LED 101, the second LED 103, and the third LED 105 may emit different red, green, and blue light. In another example, the first LED 101, the second LED 103, and the third LED 105 may emit light of different wavelengths (e.g., separated by approximately 10-30 nm) within a specific color range (e.g., 420-480 nm).

While any order of arranging different LEDs may be possible, in one embodiment a LED having an active region that emits the shortest wavelength may be the first one grown in the sequence. This arrangement may avoid or minimize internal absorption of the blue emission by the active regions of longer wavelengths.

Epitaxial growth conditions can be similar to those required for a conventional blue LED growth run using patterned or non-patterned sapphire substrates. After completing sequential growth of a n-GaN layer, blue-emitting multiple quantum wells, and a p-GaN layer that collectively form the LED 101 capable of emitting blue light, growth conditions may be changed to grow the first tunnel junction 102.

After formation of the first tunnel junction 102, the second LED 103 capable of emitting green light may be formed. The second LED 103 may be also grown in a manner similar to that of a conventional green LED. The thickness and/or growth conditions of an n-contact layer may be further modified. After completing the second semiconductor layer 109 of the second LED 103, a second tunnel junction 104 may be grown.

The third LED 105 may be a red light emitting InGaN LED. Growth of the third LED 105 may be similar to that of a conventional red LED, but the thickness and/or growth conditions of an n-contact layer can be further modified.

As will be appreciated, various designs for the first tunnel junction 102 and the second tunnel junction 104 or LED active regions can be used. The first tunnel junction 102 and the second tunnel junction 104 may aid in lateral current spreading, and may include any layer of different Group III elemental composition and/or different doping concentration to both the first semiconductor layer 107 and the second semiconductor layer 109. The first tunnel junction 102 and the second tunnel junction 104 may utilize polarization dipoles which naturally occur at interfaces between nitride layers of different Group III elemental compositions. The first tunnel junction 102 and the second tunnel junction 104 may be created by forming layers of low resistance p-type confinement in conjunction with various impurities able to generate mid gap states.

Figure 1B:
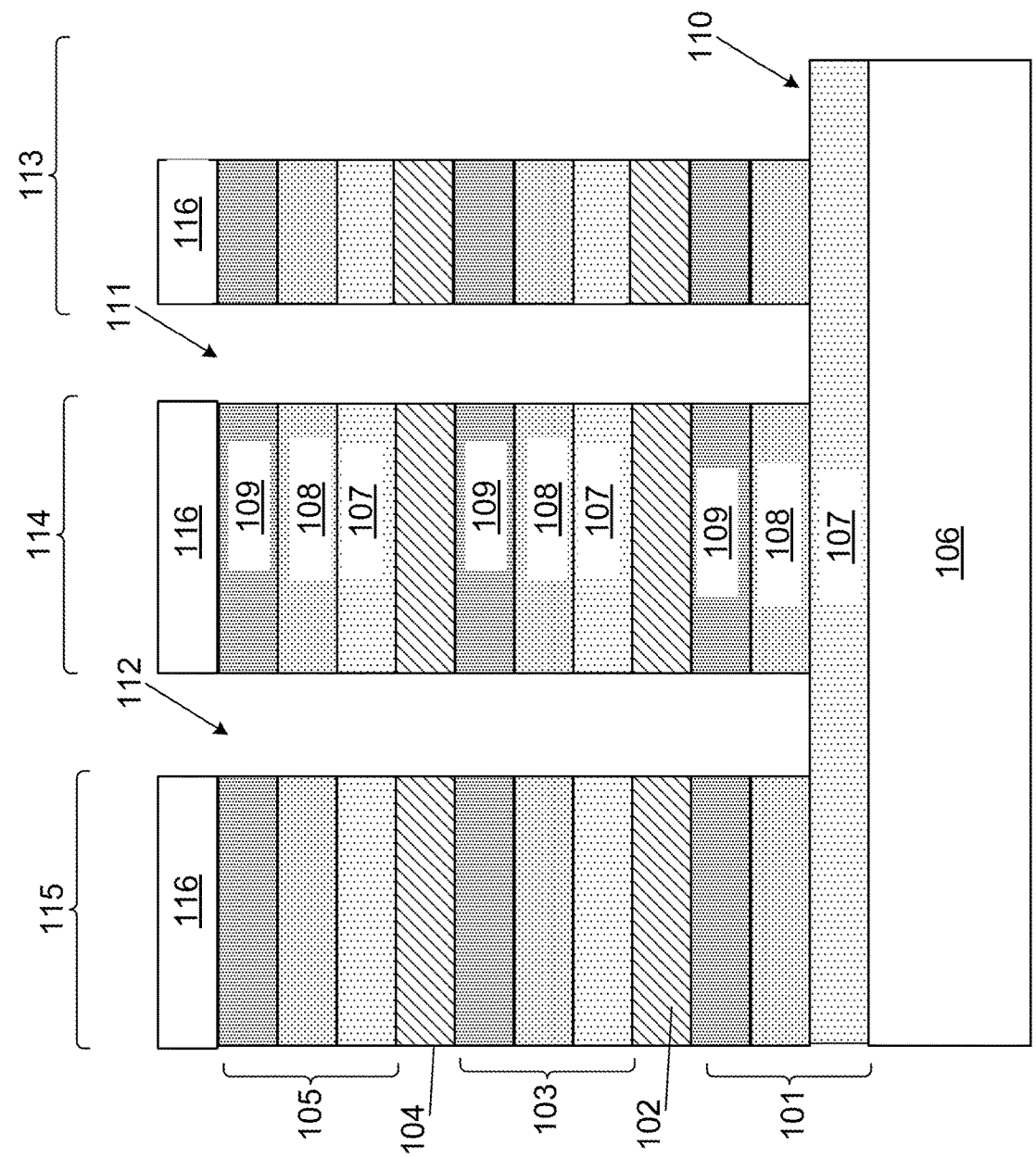
FIG. 1B shows etching a first LED, a second LED, a third LED, a first tunnel junction, and second tunnel junction to form one or more channels.

Referring now to FIG. 1B, the first LED 101, the second LED 103, and the third LED 105, each having multiple quantum wells, and the first tunnel junction 102 and the second tunnel junction 104 may be etched. The etching may include conventional photolithography and dry etch processes to define one or more channels. A first channel 111 may define a first pixel 113 and a second pixel 114. A second channel 112 may define the second pixel 114 and a third pixel 115.

Conventional dry etching processes may be used, but various combinations of masks and etch depths may be required. The conventional photoresist exposure, develop, strip and clean steps may be understood in the art and have been omitted from the figure. Layers of a conventional photoresist 116 may be formed on the first pixel 113, the second pixel 114, and the third pixel 115.

The first channel 111 and the second channel 112 may be formed by leaving portions of the LEDs unmasked during the etching. A deep etch down to the substrate 106 may be desired for these locations. A first etching process may effectively stop on the sapphire due to its very slow etching rate relative to epitaxial layers of the LEDs.

A surface of the first semiconductor layer 107 in the first LED 101 may be left during the etching process to serves as an n-contact 110 for the first pixel.

Figure 1C:
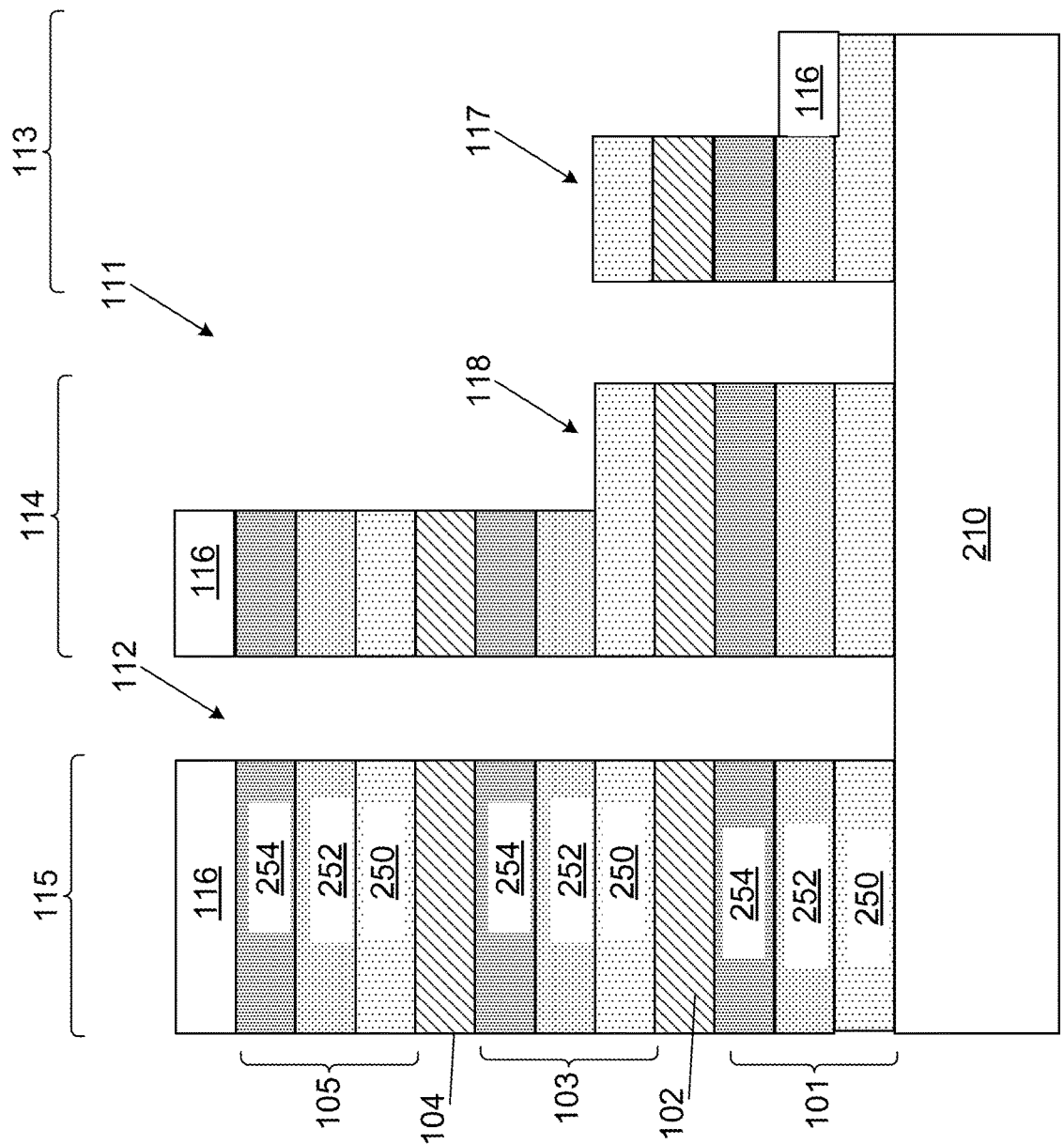
FIG. 1C shows removing different portions of the first LED, the first tunnel junction, the second LED, the second tunnel junction, and the third LED.

Referring now to FIG. 1C, different portions of the first LED 101, the first tunnel junction 102, the second LED 103, the second tunnel junction 104, and the third LED 105 may be removed in a second etching process to further define the different pixels.

Each of the first channel 111 and the second channel 112 may be extended to expose the substrate 106. The first pixel 113 may be etched to expose an upper surface 117 of the first semiconductor layer 107 in the second LED 103. The surface 117 may serve as a p-type contact for the first pixel 113 The second pixel 114 may be etched to expose the upper surface 117 of the first semiconductor layer 107 in the second LED 103 as well. The surface 118 may serve as an n-type contact for the second pixel 114.

Figure 1D:
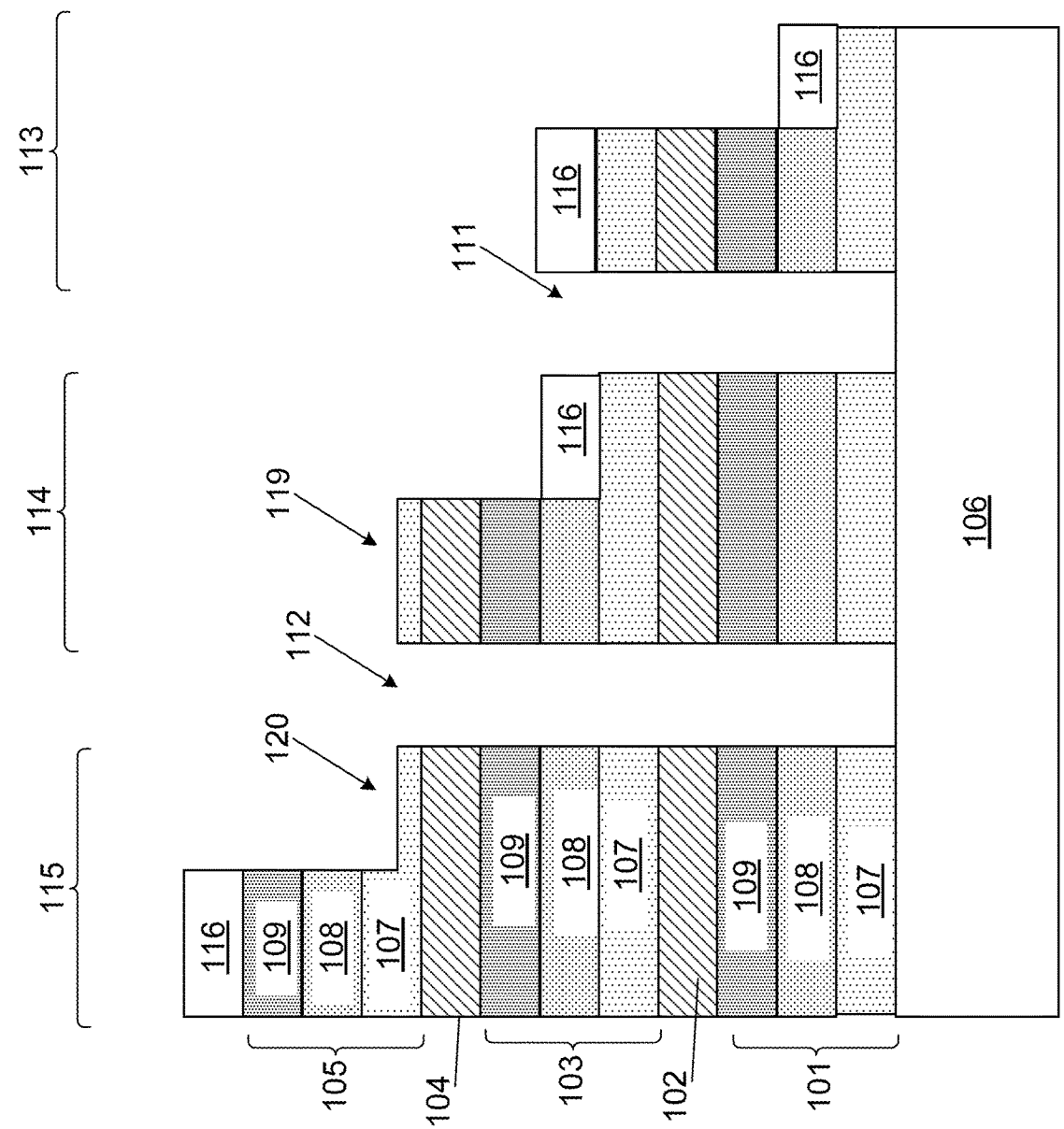
FIG. 1D shows a third etching step may to further define pixels.

Referring now to FIG. 1D, a third etching step may be performed to further define the pixels. The second pixel 114 may be etched to expose an upper surface 119 of the first semiconductor layer 107 in the third LED 105. The surface 119 may serve as a p-type contact for the second pixel 114.

The third pixel 115 may be etched to expose the upper surface 120 of the first semiconductor layer 107 in the third LED 105. The surface 120 may serve as an n-type contact for the third pixel 115. The unetched second semiconductor layer 109 in the third LED 105 may serve as an n-contact 120 for the third pixel 115. In effect, etches to the p-contact for the first pixel 113 and the second pixel 114 may remove light absorbing layers for those pixels (e.g., green and red LEDs may absorb light emitted from a blue LED).

It should be noted that the first pixel 113, the second pixel 114, and the third pixel 115 may be formed in any combination and in any configuration. For example, more than one of the first pixel 113, the second pixel 114, and the third pixel 115 may be adjacent to one another. In addition, the first pixel 113, the second pixel 114, and the third pixel 115 may be arranged such that the first pixel 113 is adjacent to the third pixel 115. In addition, a device may be formed that includes one type of pixel, two types of pixels, or all three types of pixels. In addition, the number of LEDs and tunnel junctions described above is not meant to be limiting.

In an example, p-GaN activation may be accomplished by facilitating lateral diffusion of hydrogen through sidewalls of the etched channels, an anneal can be done following photoresist strip and cleaning (i.e. after completion of the third dry etch shown in FIG. 1D). It may be advantageous to anneal at this time, rather than earlier in the process, because the defined channels between the pixels may provide an efficient path for lateral diffusion and escape of hydrogen from the p-GaN layers. Activation anneal process conditions promoting hydrogen diffusion may be similar to, or different from, those of a conventional LED and no special annealing conditions may be claimed here. Alternatively, epitaxial processes with minimal hydrogen (e.g., MBE or RPCVD) could be used for growing the tunnel junctions and an anneal to remove hydrogen by lateral diffusion would not be required.

After the p-GaN activation anneal, various additive processing steps may be needed to define electrical connections to the pixels.

Figure 1E:
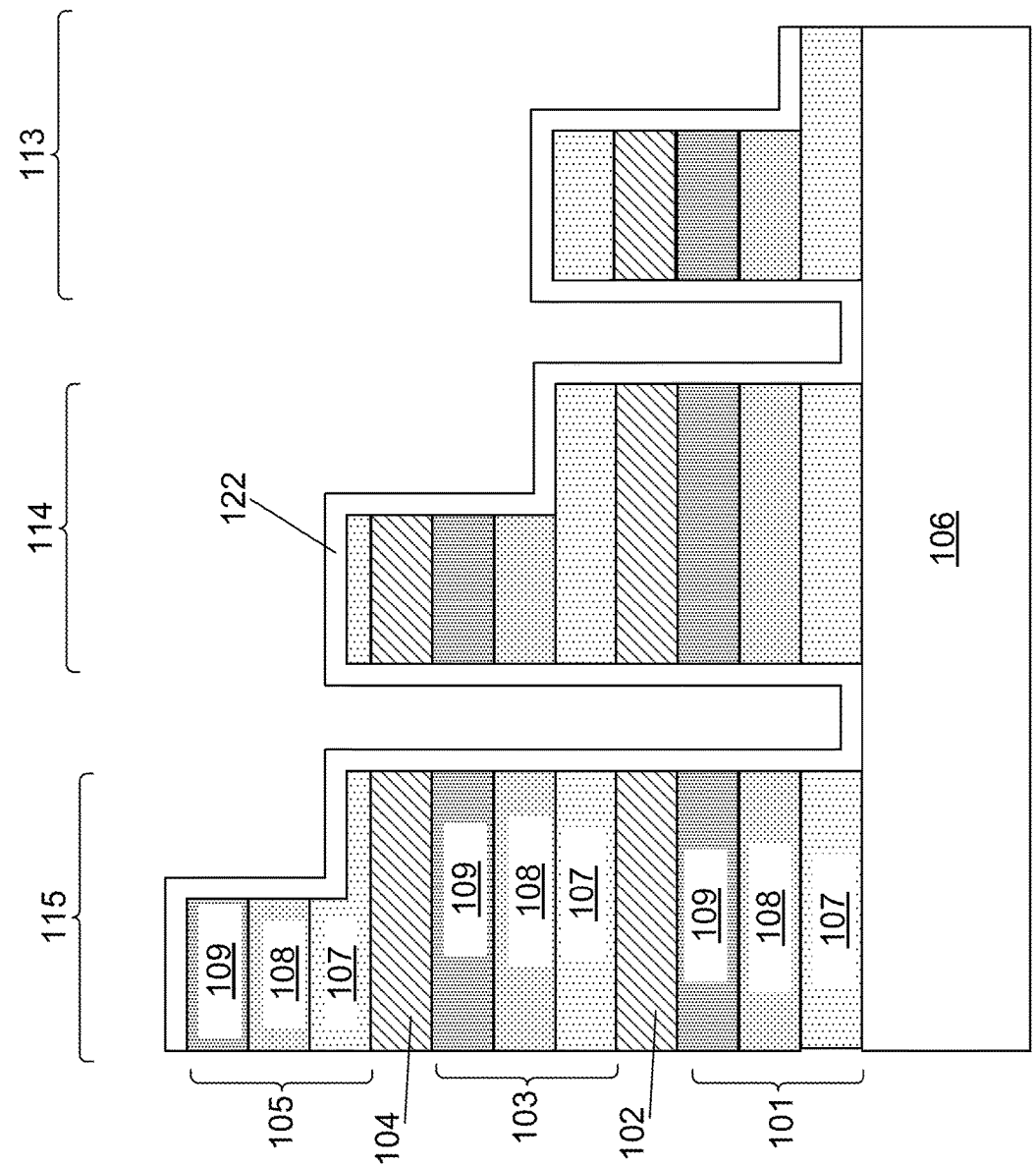
FIG. 1E shows forming a blanket conformal dielectric layer.

As seen in FIG. 1E, a conformal dielectric layer 122 may be formed on the first pixel 113, the second pixel 114, and the third pixel 115. The conformal dielectric layer 122 may be formed using a conventional deposition process, such as plasma-enhanced chemical vapor deposition. The conformal dielectric layer 122 may compose dielectric material such as silicon dioxide. The conformal dielectric layer 122 may be formed The electrically insulating conformal dielectric layer 122 may passivate mesa sidewalls and isolate from each other the metal contact pads that will be deposited in later process steps.

Figure 1F:
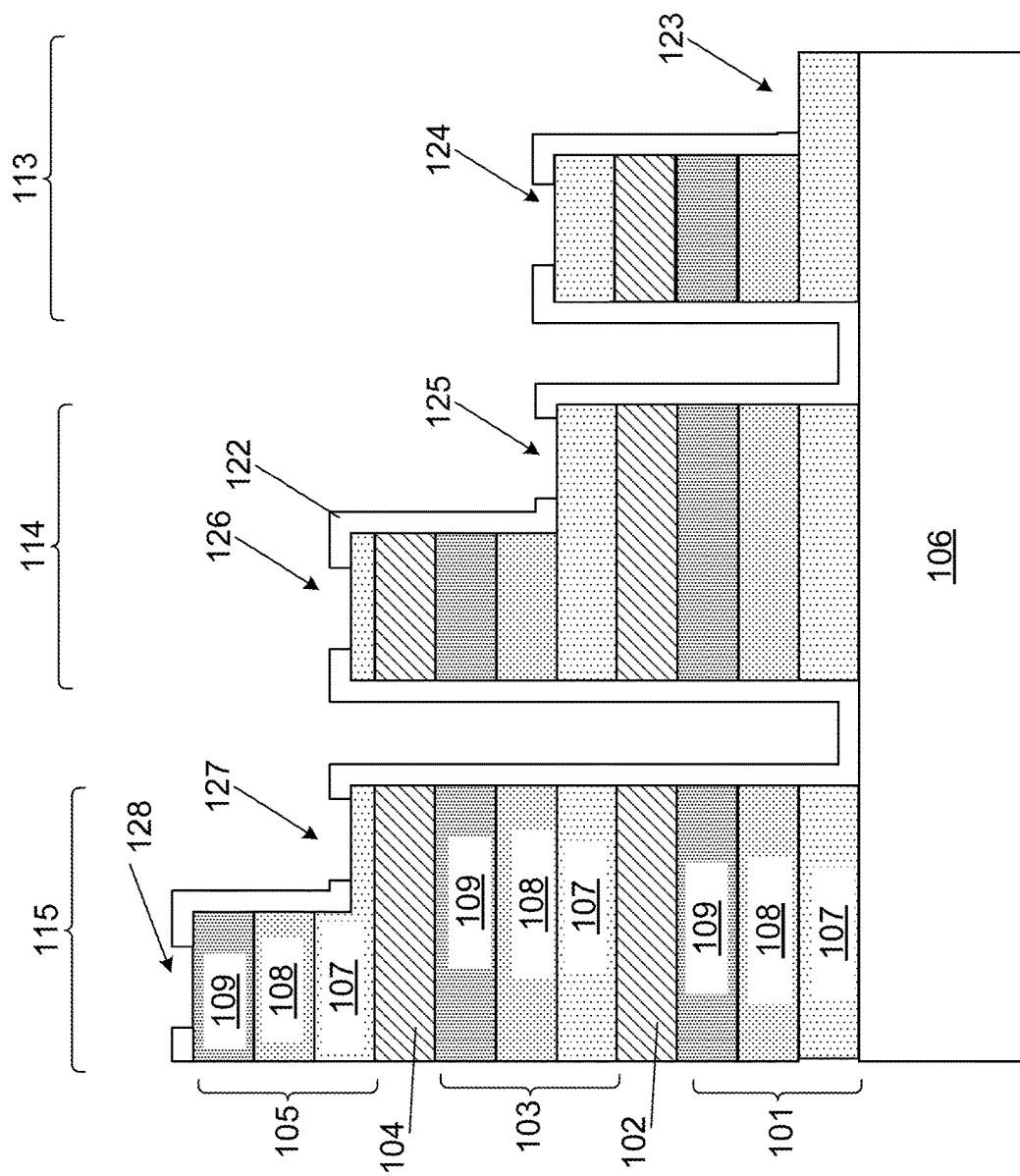
FIG. 1F shows forming openings in the conformal dielectric layer.

Referring now to FIG. 1F, openings may be formed in the conformal dielectric layer 122. Portions of the conformal dielectric layer 122 may be masked with the resist 116 as shown above with reference to FIG. 1D and portions may remain exposed. The exposed portions may be removed using a conventional etching process, such as dry action. A first opening 123 may be formed on the first pixel 113 to expose the first semiconductor layer 107 of the first LED 101. A second opening 124 may be formed on the first pixel 113 to expose the first semiconductor layer 107 of the second LED 103. A third opening 125 may be formed on the second pixel 114 to expose the first semiconductor layer 107 of the second LED 103. A fourth opening 126 may be formed on the second pixel 114 to expose the first semiconductor layer 107 of the third LED 105. A fifth opening 127 may be formed on the third pixel 115 to expose the first semiconductor layer 107 of the third LED 105. A sixth opening 128 may be formed on the third pixel 115 to expose the second semiconductor layer 109 of the third LED 105.

Figure 1G:
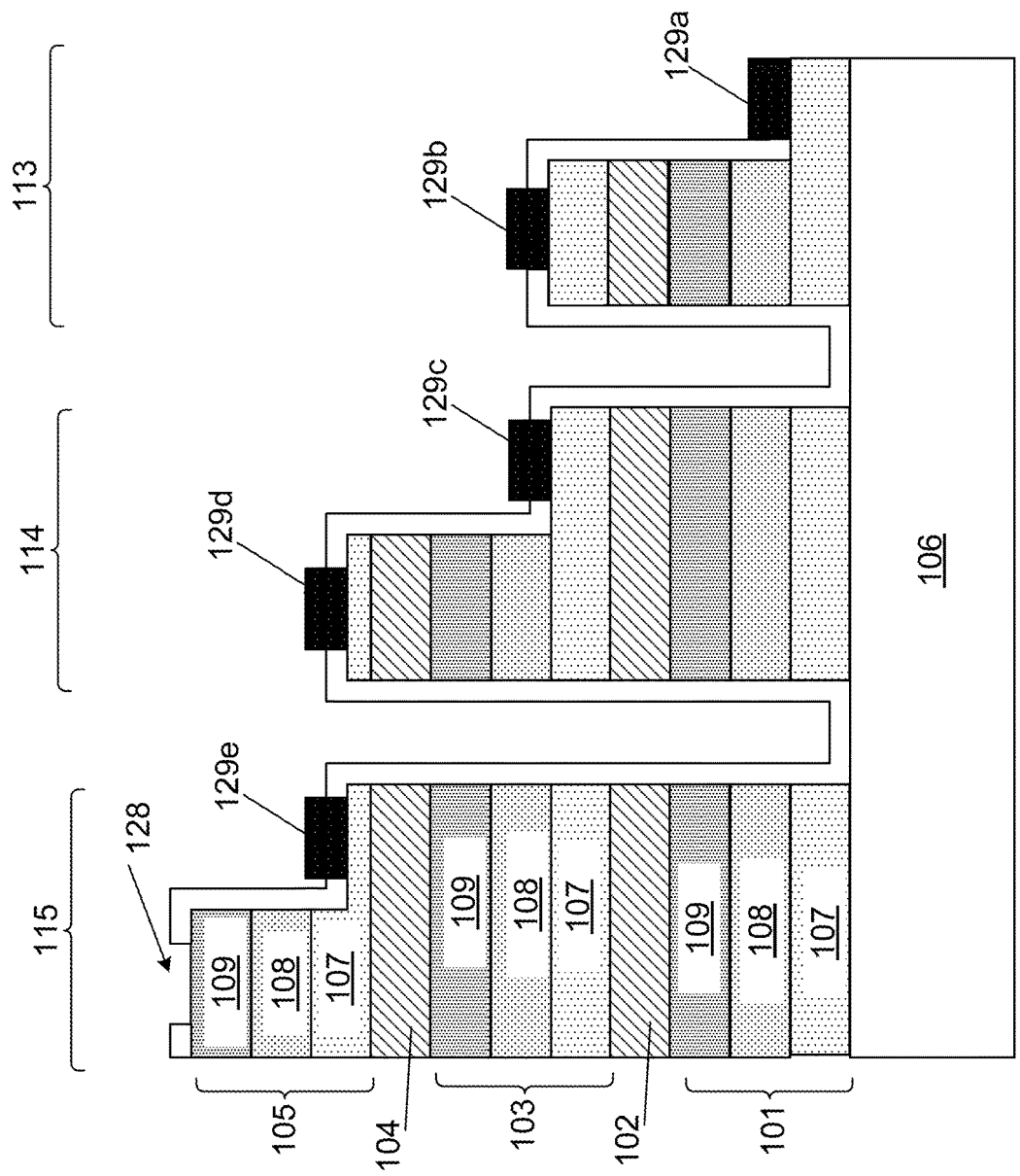
FIG. 1G shows forming contacts in the openings.

Referring now to FIG. 1G, a metal, for example an aluminum/gold bilayer may be evaporated for metallization and patterned by lift-off to form one or more of a first contact 129a, a second contact 129b, a third contact 129c, a fourth contact 129c, and fifth contact 129d. The lift-off mask openings may coincide with openings in the dielectric as shown in FIG. 1G. The first contact 129a may be formed in the first opening 123 and may be on the first semiconductor layer 107 of the first LED 101. The first contact 129a may be an n-type contact for the first pixel 113. The second contact 129b may be formed in the second opening 124 and may be on the first semiconductor layer 107 of the second LED 103 in the first pixel 113. The second contact 129b may be a p-type contact for the first pixel 113.

The third contact 129c may be formed in the third opening 125 and may be on the first semiconductor layer 107 of the second LED 103 in the second pixel 114. The third contact 129c may be an n-type contact for the second pixel 114. The fourth contact 129d may be formed in the fourth opening 126 and may be on the first semiconductor layer 107 of the third LED 105 in the second pixel 114. The fourth contact 129d may be a p-type contact for the second pixel 114.

The fifth contact 129d may be formed in the fifth opening 127 and may be on the first semiconductor layer 107 of the third LED 105 in the third pixel 115. The fifth contact 129d may be an n-type contact for the third pixel 115.

Figure 1H:
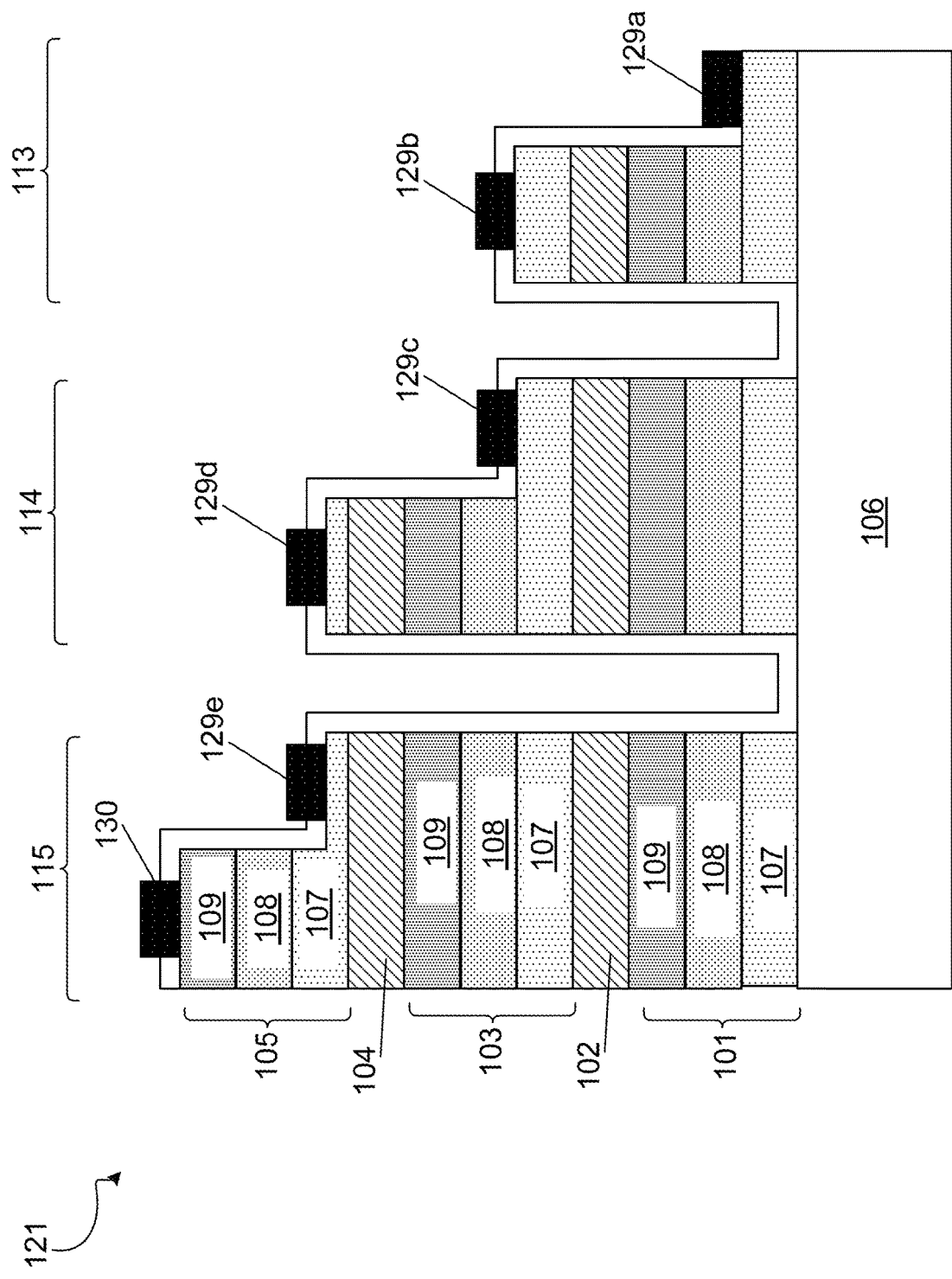
FIG. 1H shows forming another contact in an opening to form an LED array.

As shown in FIG. 1H, a sixth contact 130 may be formed in the sixth opening 128 on the third pixel 115 using a metallization process. The sixth contact 130 may compose silver and may be similarly evaporated and patterned onto the second semiconductor layer 109 of the third LED 105 to form an LED array 121 as shown in FIG. 1H.

Figure 1I:
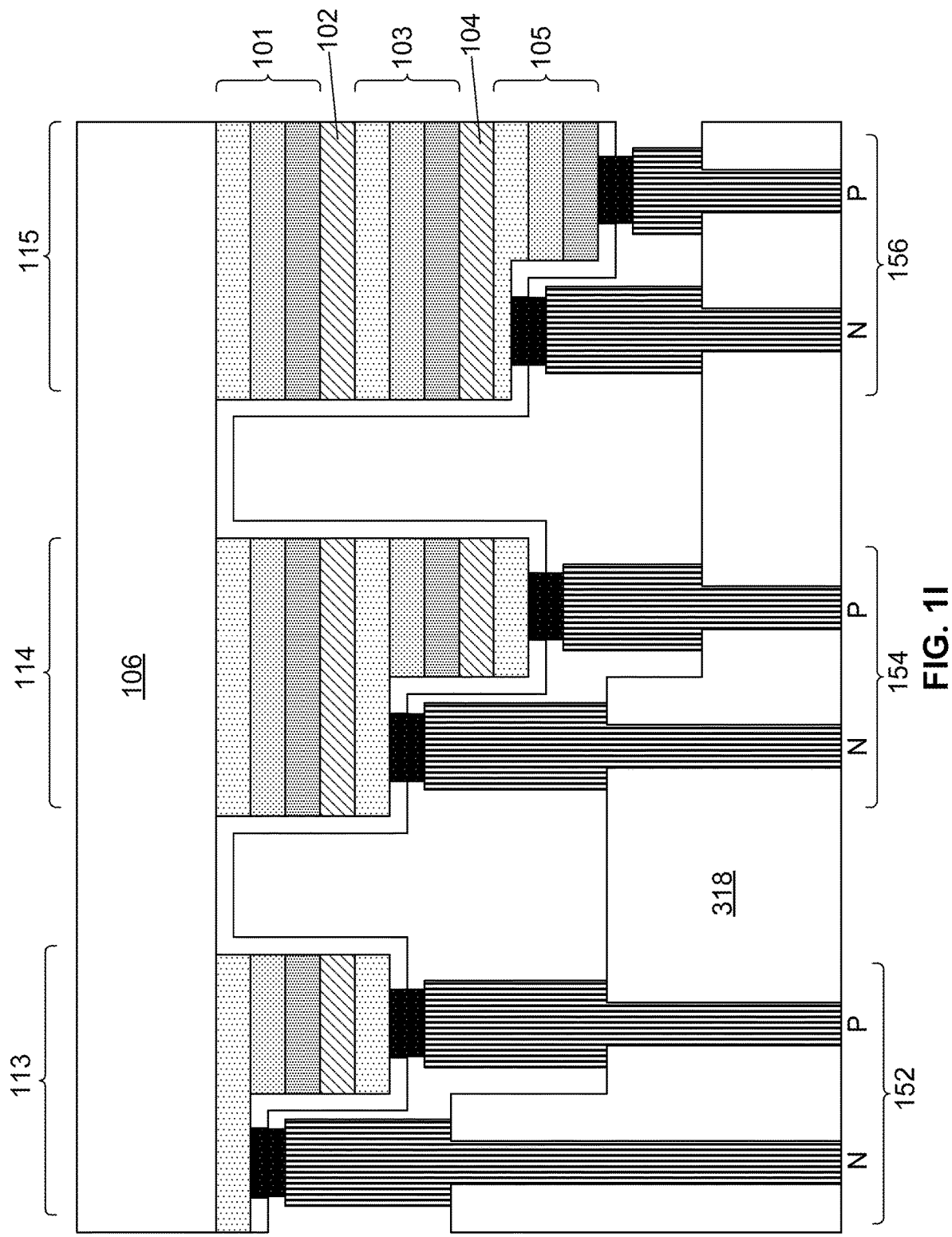
FIG. 1I shows attaching the LED array to an LED device attach region.

As seen with respect to FIG. 1I, after wafer singulation, the LED array 121 may be attached to a LED device attach region 318, as described in further detail below. In an example, the LED device attach region 318 may be a complementary metal oxide semiconductor (CMOS) integrated circuit (IC) array having metal interconnect bonding corresponding to the contacts formed on the LED array 121. A first surface of the LED device attach region 318 may have one or more interconnect bumps corresponding to the contacts on the pixels. The interconnect bumps may have different heights defined to match the first pixel 113, the second pixel 114, and the third pixel 115, allowing use of substantially same size interconnect bonding structures. In other variations, the first surface of the LED device attach region 318 may be substantially flat, and interposers or connecting pillars of differing height can be used. Driver circuitry as described below with FIG. 4B may be coupled to the LED device attach region 318 to allow each contact pair of the first pixel 113, the second pixel 114, and the third pixel 115 to be biased independently at a desired voltage. For example, the driver circuitry may include a driver configured to provide a first driving current to a first pair of electrodes 152 coupled to the first pair of contacts (129a and 129b), a second pair of electrodes 154 coupled to the second pair of contacts (129c and 129d), and a third pair of electrodes 156 coupled to the third pair of contacts (129e and 130).

For example, the LED device attach region 318 may be configured to provide a voltage to only the first contact 129a and the second contact 129b of the first pixel 113 (collectively referred to as a first pair of contacts), a voltage to only the third contact 129c and the fourth contact 129d of the second pixel 114 (collectively referred to as a second pair of contacts), and a voltage to only the fifth contact 129e and the sixth contact 130 of the third pixel 115 (collectively referred to as a third pair of contacts). The LED device attach region 318 may be configured to provide voltages in any combination of those described above. The LED device attach region 318 may be coupled to the LED device attach region 318 described below with reference to FIG. 3.

Light of a first wavelength be emitted from the first pixel 113, light of a second wavelength may be emitted from the second pixel 114, and light of a third wavelength may be emitted from the third pixel through the substrate 106.

Figure 1J:
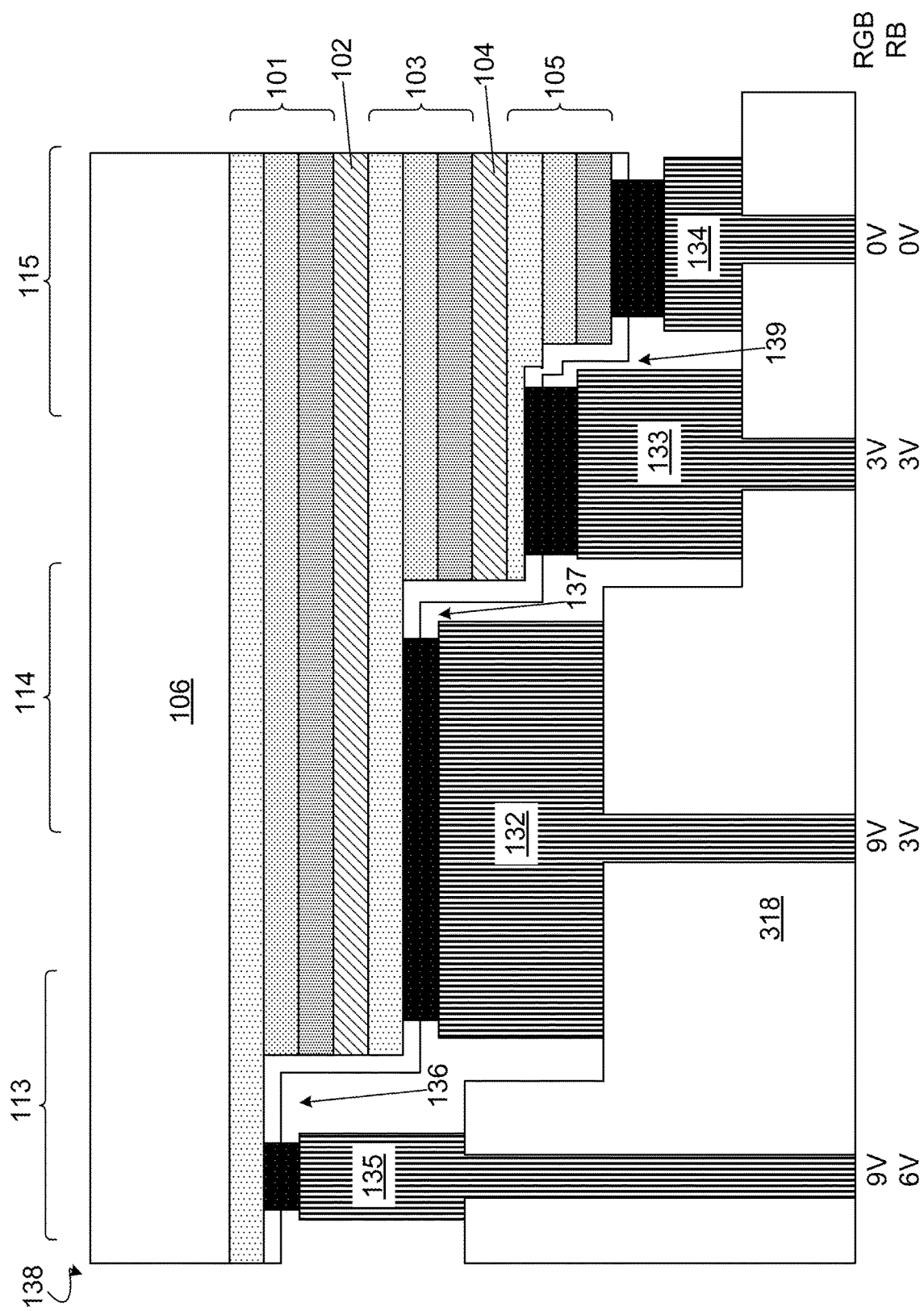
FIG. 1J shows another example of an LED array.

Referring now to FIG. 1J, another example of an LED array 138 is shown. The LED array 138 may be formed using the same or similar epitaxial growth processes and wafer processing steps as described above, but using a different mask set to etch the different layers. The masks used for this embodiment may be modified to prevent etching of a channel down to the substrate 106.

The channels 136, 137, and 139 may be masked for all etching steps, but may be left unmasked for the metal deposition steps described above. This may result in an LED array 138 having a first common electrode 132 that may be used for the p-contact of the first pixel 113 and the n-contact of the second pixel 114 and a second common electrode 133 that may be used for the p-contact of the second pixel 114 and the n-contact of the third pixel 115. It may be possible to generate electroluminescence from any one of the individual active regions or any combination thereof (including all three) by applying appropriate bias to the driving electrodes 132, 133, or 135 relative to a ground electrode 134. For example, the driving voltage may be a combination of 3/6/9V that results in the illumination of the first pixel 113, the second pixel 114, and the third pixel 115 together. A combination of 3/3/6V may result in the illumination of the third pixel 115 and the first pixel 113 without passing any current through the second pixel 114.

While potentially requiring greater voltages when the first LED 101, the second LED 103, and the third LED 105 may be simultaneously emitting light, the LED array 138 may support higher pixel resolution due to reduction of overall footprint of the LED array 138 (i.e., a single uLED may produce all wavelengths which previously required 3 uLEDs to produce). The smaller footprint may be a result of the smaller required electrical contact area, and the lack of isolating gaps between the pixels of separate wavelengths. Complexity of the printed circuit board may also be reduced.

To support an ever-increasing volume of data traffic transmitted using wireless communications, development of Gbit/sec class communication systems is necessary. However, there is currently insufficient available radio spectrum to develop radio-frequency wireless systems with speeds in the Gbit/sec range. One alternative to radio-frequency wireless is provided by visible light communications (VLC) that use wavelengths in the visible region of the spectrum. VLC is a data communications variant which uses visible light between 140 and 800 THz (780-375 nm). VLC is a subset of optical wireless communications technologies. VLC may use fluorescent lamps (e.g., ordinary lamps, not special communications devices) to transmit signals at 10 kbit/s, or LEDs for up to 112 Mbit/s over short distances. Systems may be able to transmit at full Ethernet speed (10 Mbit/s) over distances of 1-2 kilometres (0.6-1.2 mi).

Specially designed electronic devices generally containing a photodiode may receive signals from light sources, although in some cases conventional cell phone cameras or digital cameras may be sufficient. The image sensor used in these devices may be an array of photodiodes (i.e., pixels) and in some applications, the use of LED arrays may be preferred over a single photodiode. Such a sensor may provide either multi-channel (e.g., 1 pixel=1 channel) or a spatial awareness of multiple light sources.

VLC may potentially provide on the order of THz/sec of unlicensed bandwidth, support a high degree of spatial reuse, and allow for higher security due to inherent difficulties in intercepting. Furthermore, VLC can use existing infrastructure designed for illumination which can make possible an additional wireless transmission capacity with comparatively small capital investment.

The data transmission rates possible with conventional phosphor-converted white LEDs may be generally limited to under 100 MBps due to the slow temporal response of the phosphor among other factors. On the other hand, a white light source that mixes wavelengths emitted from two or more independently modulated LED sources has increased bandwidth and is capable of data transmission rates up to 5 GBps.

A white light source comprised of three separate blue, green, and red LED chips could satisfy the requirements for both illumination and high bandwidth VLC applications. Alternatively, multiple blue chips (each with a phosphor to make white light) with peak wavelengths (WLs) differing by 20 nm or more could be put into a single package to increase bandwidth with filters used on each detector to prevent cross-talk between the different blue sources. Unfortunately for both these alternatives, the significant amount of space required for assembly of multiple separate chips prevents design of compact, highly directional VLC systems.

The devices described above may support VLC applications. The first contact 129a, the second contact 129b, the third contact 129c, the fourth contact 129c, the fifth contact 129d, and the sixth contact 130 may be independently drivable to define light emission from each of the first pixel 113, the second pixel, 114, and the third pixel 115 to support VLC protocols.

Figure 1K:
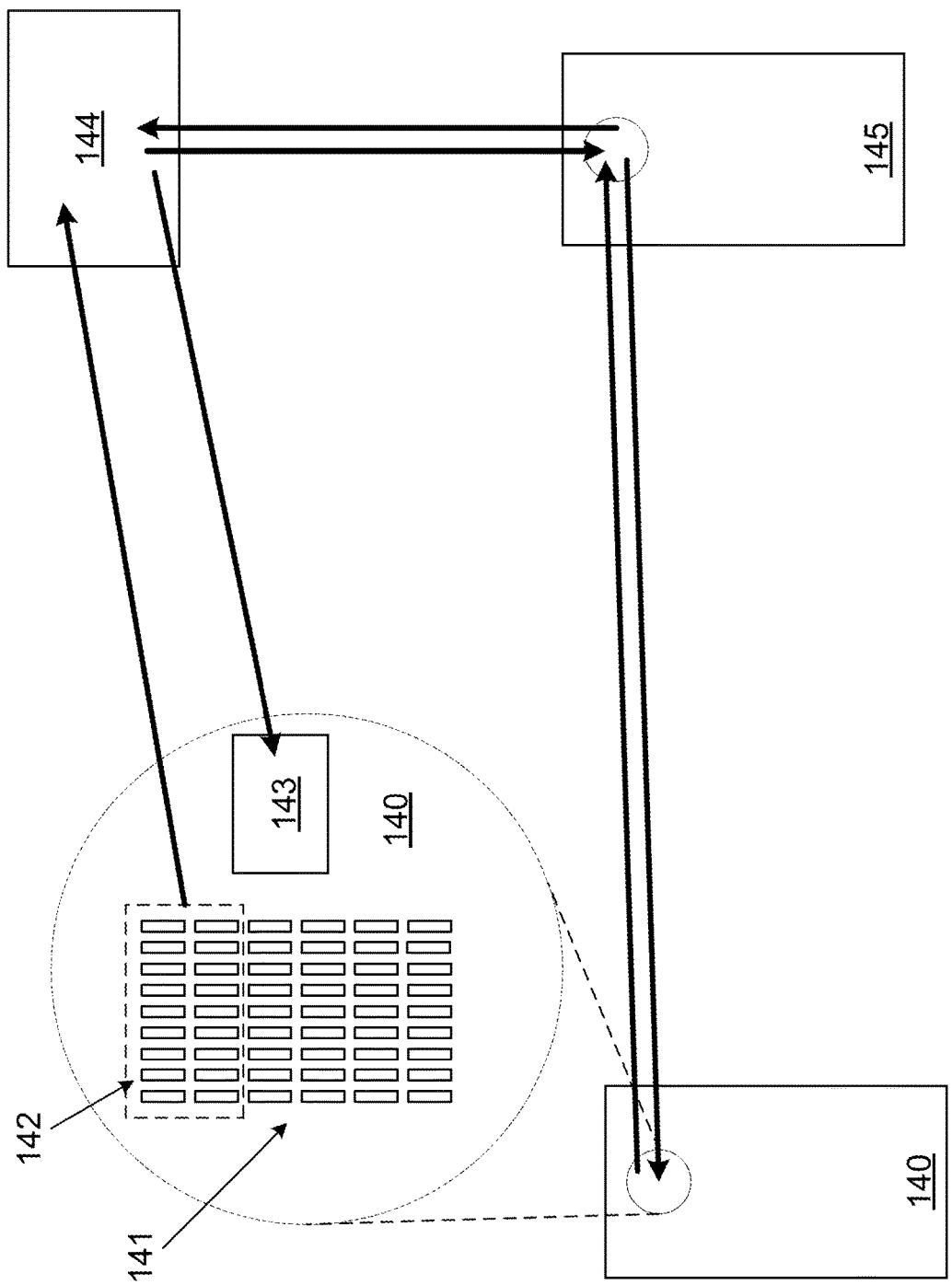
FIG. 1K shows the LED array forming a part of a visible light communication (VLC) system.

Referring now to FIG. 1K, a diagram illustrating a combined display and VLC system 140 is illustrated. A smartphone 402 having a display 141, VLC emitter 142, and VLC receiver 143 (shown as not to scale magnified cartoon) may be used to interact with other devices such as ceiling mounted LED light 144 or another smartphone 145 that support VLC protocols such as Li-Fi.

The VLC emitter 142 may also be capable of acting as a display, but the display and VLC functionality may be separate. The VLC emitter 142 may include the LED array 121 and the LED array 138 described above.

The VLC receiver 143 may include an avalanche photodiode, or when more sensitive operation is required, a single photon avalanche diode (SPAD). The smartphone 402 may include circuitry to convert data needing transmission into a suitable driving modulation of the selected VLC emitters. The smartphone 402 may also include circuitry to convert received light modulations from the VLC receiver into available data. The VLC receiver 143 may be the sensor module 314 described below with reference to FIG. 3.

Figure 1L:
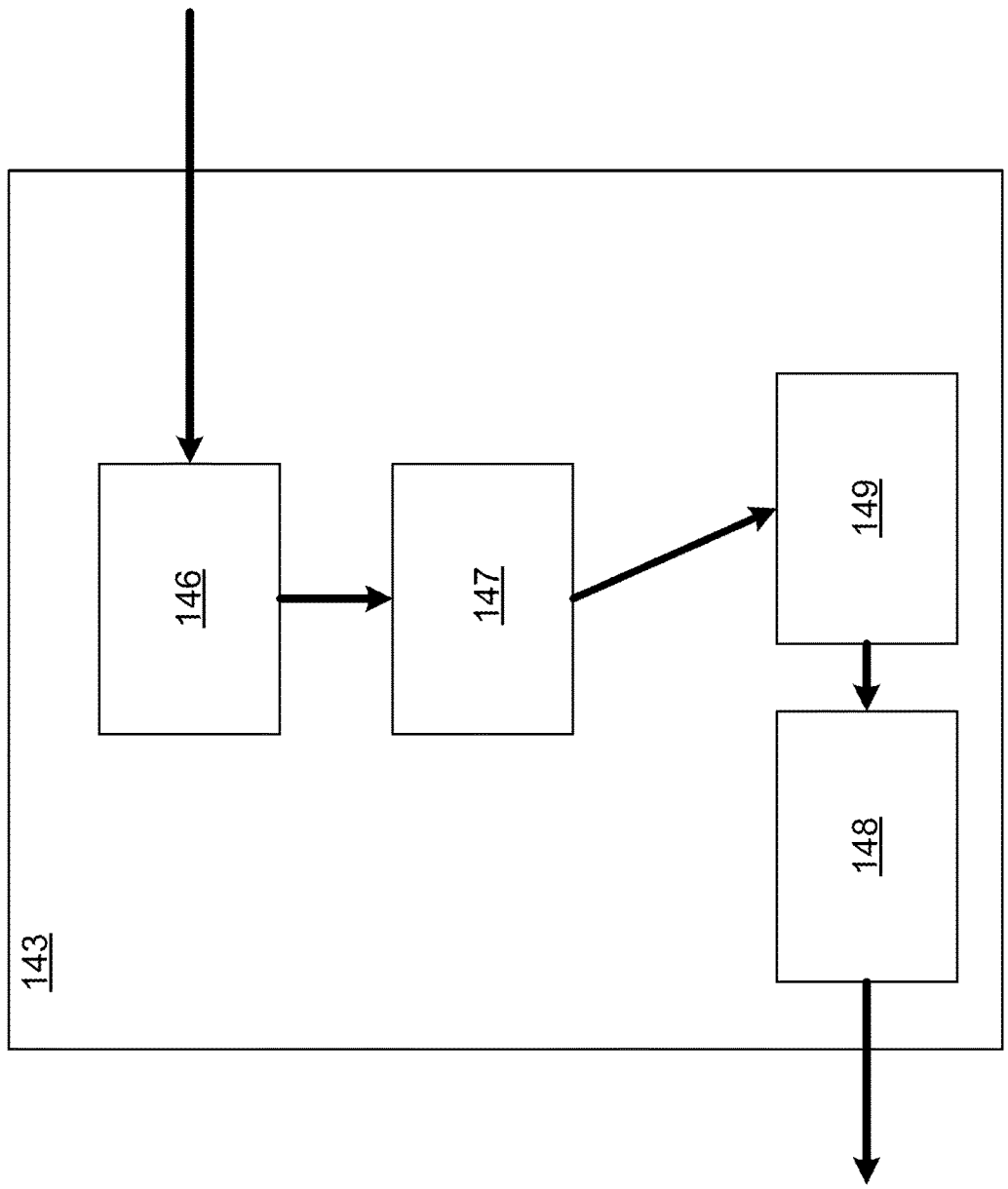
FIG. 1L shows a VLC receiver.

Referring now to FIG. 1L, a diagram illustrating the VLC receiver 143 is shown. The VLC receiver 143 may include an amplification circuit 149 and an optical filter and optical concentrators 146. Beam divergence may occur in LEDs due to illuminating large areas results in attenuation. The optical concentrator 146 may be used to compensate this type of attenuation. In addition, VLC may be vulnerable to interference from other sources such as sunlight and other illumination. Therefore, the optical filters 146 may be used to mitigate the DC noise components present in the received signal.

In the VLC receiver 143, light may be detected using a photodiode 147 and may be converted to photo current. The photodiode may include one or more of a silicon photodiode, a PIN diode, and avalanche photodiode. The photodiode 451 may include one or more of the first pixel 113, the second pixel 114, and the third pixel 115. The photo current may be received by a clock and data recovery (CDR) unit 148. The CDR unit 148 may provide an output to one or more circuits in the VLC system 140.

Light may pass through optical filter and optical concentrators 146 and be detected by the photodiode 147. The amplification circuit 149 may amplify the signal and provide it to the CDR unit 148, which may decode and process the signal.

Independent electrical connections may be made to the first pixel 113, the second pixel 114, and the third pixel 115 to allow for high speed light intensity modulation and data transfer using IEEE 802.15.7 or other suitable wireless protocols. Since multiple wavelengths may be supported, improved protocols based on optical orthogonal frequency-division multiplexing (O-OFDM) modulation may be used. A VLC signal may be directed to an LED array having stacked active regions emitting light of different wavelength. Each pixel may emit different wavelengths or alternatively, each pixel can emit more than one wavelength.

Use of a multiple wavelength system such as the LED array 121 and the LED array 138 may deliver connections having a data transfer rate up to about 5 Gbps, comparing favorably to phosphor coated white LEDs only able deliver up to about 100 Mbps.

Color shift keying (CSK), outlined in IEEE 802.15.7, is an intensity modulation based modulation scheme for VLC. CSK is intensity-based, as the modulated signal takes on an instantaneous color equal to the physical sum of three RGB LED instantaneous intensities. This modulated signal jumps instantaneously, from symbol to symbol, across different visible colors. Accordingly, CSK may be construed as a form of frequency shifting. However, this instantaneous variation in the transmitted color may not be humanly perceptible, because of the limited temporal sensitivity in the human vision. A critical flicker fusion threshold (CFF) and a critical color fusion threshold (CCF), may limit humans from resolving temporal changes shorter than 0.01 second. Transmissions from the LED array 121 and the LED array 138 may be preset to time-average (over the CFF and the CCF) to a specific time-constant color. Humans may perceive only the preset color that seems constant over time, but cannot perceive the instantaneous color that varies rapidly in time. In other words, CSK transmission may maintain a constant time-averaged luminous flux, even as its symbol sequence varies rapidly in chromaticity.

Figure 1M:
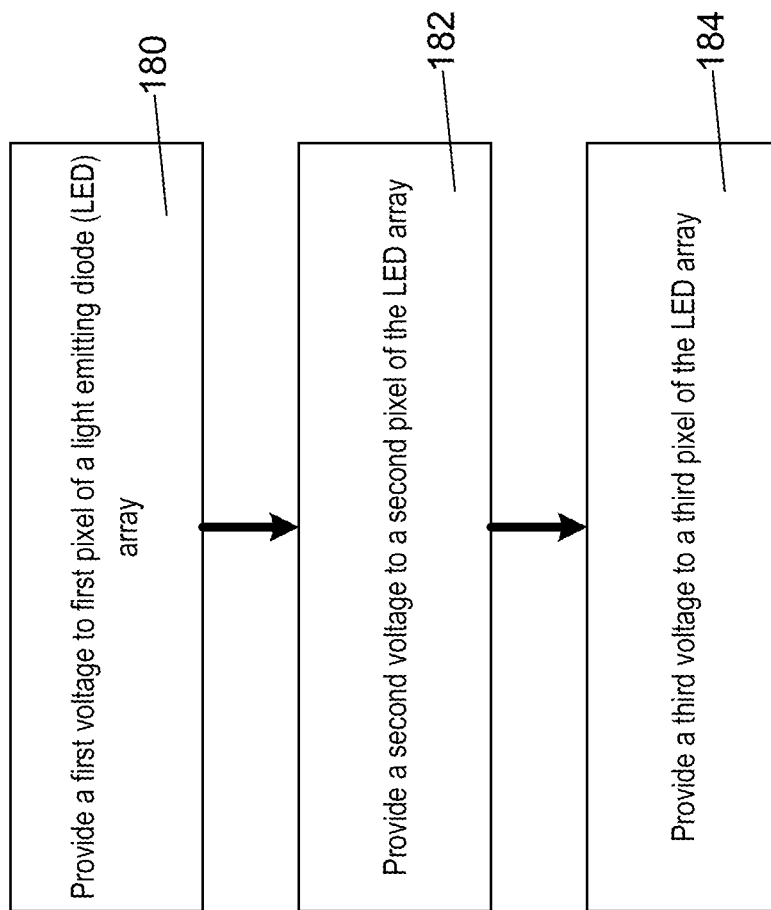
FIG. 1M is a flowchart illustrating a method of use.

Referring now to FIG. 1M, a flowchart illustrating a method for use of an LED array is shown. In step 180, a first voltage may be provided to a first pixel of the LED array. In step 182, a second voltage may be provided to a second pixel of the LED array. The first pixel and the second pixel may be separated by a first trench extending to a substrate. In step 184, a third voltage may be provided to a third pixel of the LED array. The second pixel and the third pixel may be separated by a second trench extending to the substrate.

Figure 1N:
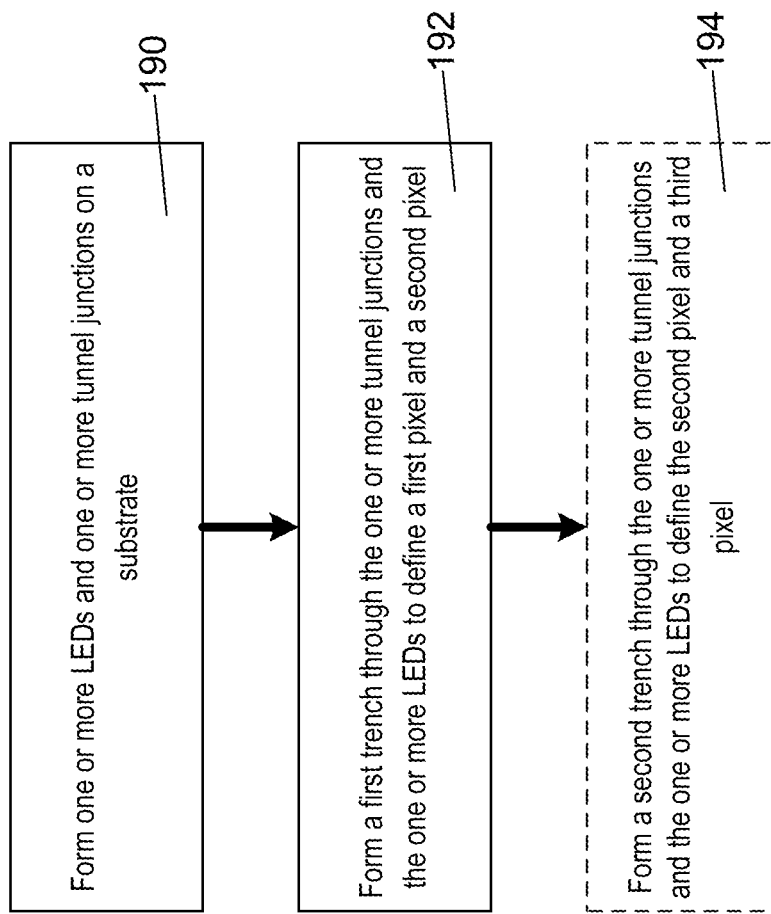
FIG. 1N is a flowchart illustrating a method of forming a device.

Referring now to FIG. 1N, a flowchart illustrating a method of forming a device is shown. In step 190, one or more LEDs and one or more tunnel junctions may be formed on a substrate. In step 192, a first trench may be formed through the one or more tunnel junctions and the one or more LEDs to define a first pixel and a second pixel. The first trench may extend to the substrate. In an optional step 194, a second trench may be formed through the one or more tunnel junctions and the one or more LEDs to define the second pixel and a third pixel.

A device may include a first light emitting diode (LED) on a first surface of a substrate, a first tunnel junction on the first LED a first semiconductor layer on the first tunnel junction, and a conformal dielectric layer on at least a sidewall of the LED and the first surface of the substrate.

The device may include a first contact on a layer of the first LED and a second contact on the first semiconductor layer.

The device may include a second LED on the first tunnel junction, the second LED comprising the first semiconductor layer, a second tunnel junction on the second LED, and a second semiconductor layer on the second tunnel junction.

The device may include a third contact on a layer of the second LED and a fourth contact on the second semiconductor layer.

The device may include a third LED on the second tunnel junction, the third LED comprising the second semiconductor layer The device may include a fifth contact on a first layer of the third LED and a sixth contact on a second layer of the third LED.

The device may include the conformal dielectric layer on the first tunnel junction, the second LED, the second tunnel junction, and the third LED.

A LED array may include a first pixel and a second pixel on a substrate, the first pixel and the second pixel comprising one or more tunnel junctions on one or more LEDs, and a first trench between the first pixel and the second pixel, the trench extending to the substrate.

The first pixel may comprise a first LED on the substrate, a first tunnel junction on the first LED, and a first semiconductor layer on the tunnel junction.

The LED array may include a first contact on a layer of the first LED and a second contact on the first semiconductor layer.

The second pixel may include a first LED on the substrate, a first tunnel junction on the first LED, a second LED on the first tunnel junction, a second tunnel junction of the second LED, and a second semiconductor layer on the second tunnel junction.

The LED array may include a second contact on a layer of the second LED, and a second contact on the second semiconductor layer.

The LED array may include a third pixel on the substrate, the third pixel comprising one or more tunnel junctions formed on one or more LEDs, a second trench between the second pixel and the third pixel, the trench extending to the substrate.

The third pixel may include a first LED on the substrate, a first tunnel junction on the first LED, a second LED on the first tunnel junction, a second tunnel junction on the second LED, and a third LED on the second tunnel junction.

The LED array may include a fifth contact on a first layer of the third LED and a sixth contact on a second layer of the third LED.

A method may include forming one or more LEDs and one or more tunnel junctions on a substrate and forming a first trench through the one or more tunnel junctions and the one or more LEDs to define a first pixel and a second pixel, the first trench extending to the substrate.

The first pixel may include a first LED on the substrate, a first tunnel junction on the first LED, a first semiconductor layer on the tunnel junction.

The second pixel may include a first LED on the substrate, a first tunnel junction on the first LED, a second LED on the first tunnel junction, a second tunnel junction of the second LED, and a second semiconductor layer on the second tunnel junction.

The method may include forming a second trench through the one or more tunnel junctions and the one or more LEDs to define the second pixel and a third pixel, the second trench extending to the substrate.

The third pixel may include a first LED on the substrate, a first tunnel junction on the first LED, a second LED on the first tunnel junction, a second tunnel junction on the second LED, and a third LED on the second tunnel junction.

Figure 2A:
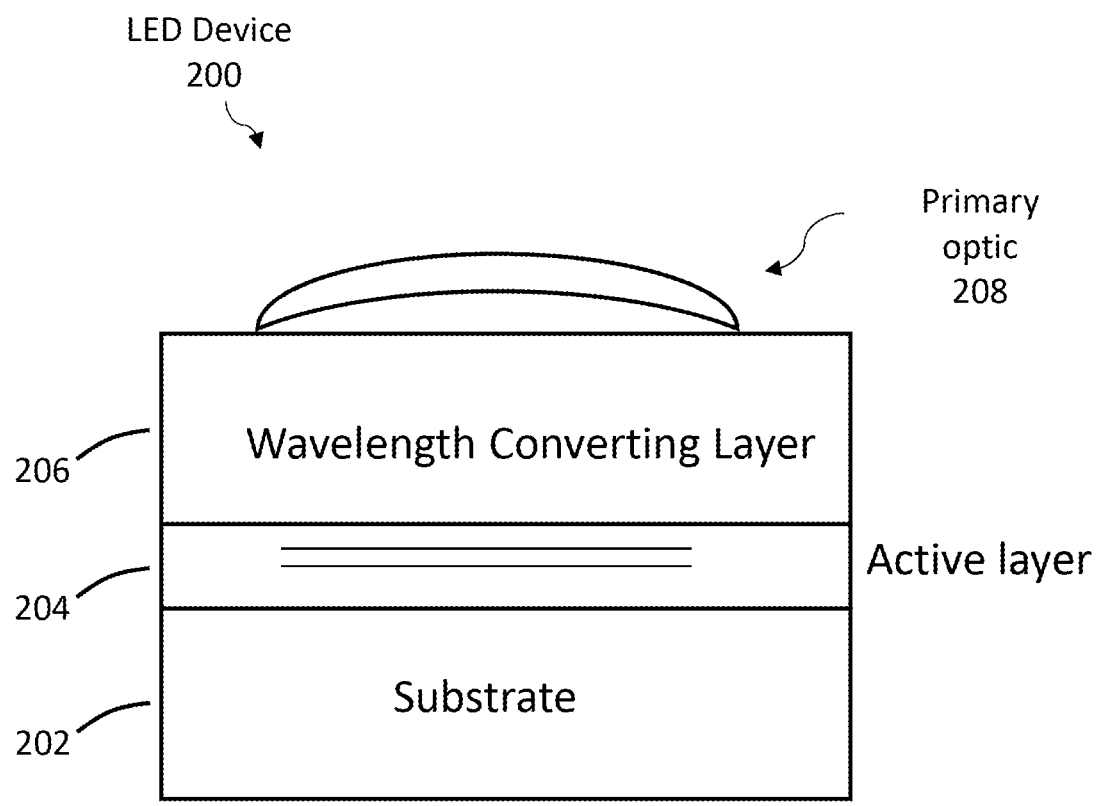
FIG. 2A is a diagram showing an Light Emitting Diode (LED) device.

FIG. 2A is a diagram of an LED device 200 in an example embodiment. The LED device 200 may include a substrate 202, an active layer 204, a wavelength converting layer 206, and primary optic 208. In other embodiments, an LED device may not include a wavelength converter layer and/or primary optics.

As shown in FIG. 2A, the active layer 204 may be adjacent to the substrate 202 and emits light when excited. Suitable materials used to form the substrate 202 and the active layer 204 include sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof.

The wavelength converting layer 206 may be remote from, proximal to, or directly above active layer 204. The active layer 204 emits light into the wavelength converting layer 206. The wavelength converting layer 206 acts to further modify wavelength of the emitted light by the active layer 204. LED devices that include a wavelength converting layer are often referred to as phosphor converted LEDs ("PCLED"). The wavelength converting layer 206 may include any luminescent material, such as, for example, phosphor particles in a transparent or translucent binder or matrix, or a ceramic phosphor element, which absorbs light of one wavelength and emits light of a different wavelength.

The primary optic 208 may be on or over one or more layers of the LED device 200 and allow light to pass from the active layer 204 and/or the wavelength converting layer 206 through the primary optic 208. The primary optic 208 may be a lens or encapsulate configured to protect the one or more layers and to, at least in part, shape the output of the LED device 200. Primary optic 208 may include transparent and/or semi-transparent material. In example embodiments, light via the primary optic may be emitted based on a Lambertian distribution pattern. It will be understood that one or more properties of the primary optic 208 may be modified to produce a light distribution pattern that is different than the Lambertian distribution pattern.

Figure 2B:
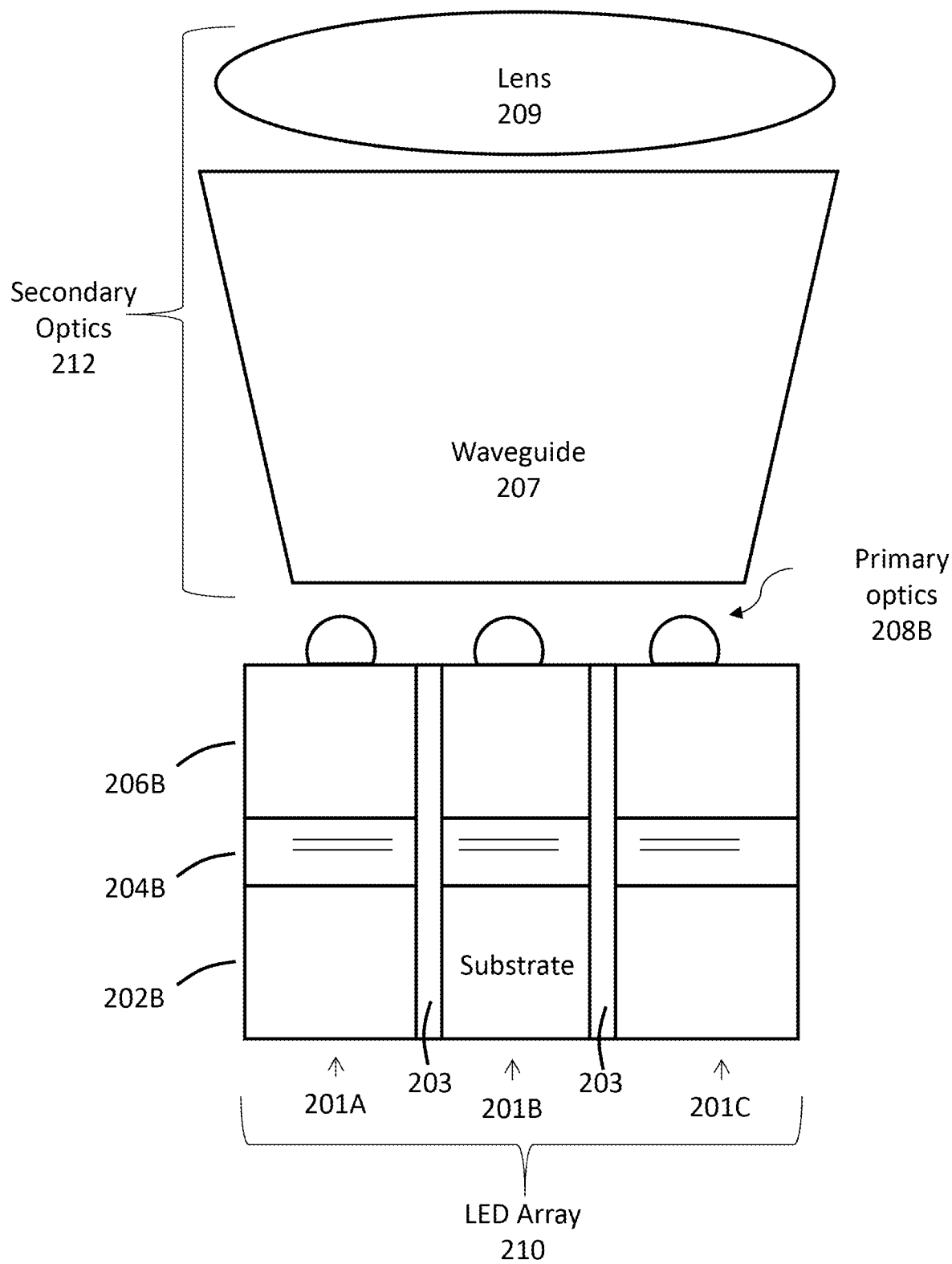
FIG. 2B is a diagram showing an LED system with secondary optics.

FIG. 2B shows a cross-sectional view of a lighting system 220 including an LED array 210 with pixels 201A, 201B, and 201C, as well as secondary optics 212 in an example embodiment. The LED array 210 includes pixels 201A, 201B, and 201C each including a respective wavelength converting layer 206B active layer 204B and a substrate 202B. The LED array 210 may be a monolithic LED array manufactured using wafer level processing techniques, a micro LED with sub-500 micron dimensions, or the like. Pixels 201A, 201B, and 201C, in the LED array 210 may be formed using array segmentation, or alternatively using pick and place techniques.

The spaces 203 shown between one or more pixels 201A, 201B, and 201C of the LED devices 200B may include an air gap or may be filled by a material such as a metal material which may be a contact (e.g., n-contact).

The secondary optics 212 may include one or both of the lens 209 and waveguide 207. It will be understood that although secondary optics are discussed in accordance with the example shown, in example embodiments, the secondary optics 212 may be used to spread the incoming light (diverging optics), or to gather incoming light into a collimated beam (collimating optics). In example embodiments, the waveguide 207 may be a concentrator and may have any applicable shape to concentrate light such as a parabolic shape, cone shape, beveled shape, or the like. The waveguide 207 may be coated with a dielectric material, a metallization layer, or the like used to reflect or redirect incident light. In alternative embodiments, a lighting system may not include one or more of the following: the wavelength converting layer 206B, the primary optics 208B, the waveguide 207 and the lens 209.

Lens 209 may be formed form any applicable transparent material such as, but not limited to SiC, aluminum oxide, diamond, or the like or a combination thereof. Lens 209 may be used to modify the a beam of light input into the lens 209 such that an output beam from the lens 209 will efficiently meet a desired photometric specification. Additionally, lens 209 may serve one or more aesthetic purpose, such as by determining a lit and/or unlit appearance of the p 201A, 201B and/or 201C of the LED array 210.

Figure 3:
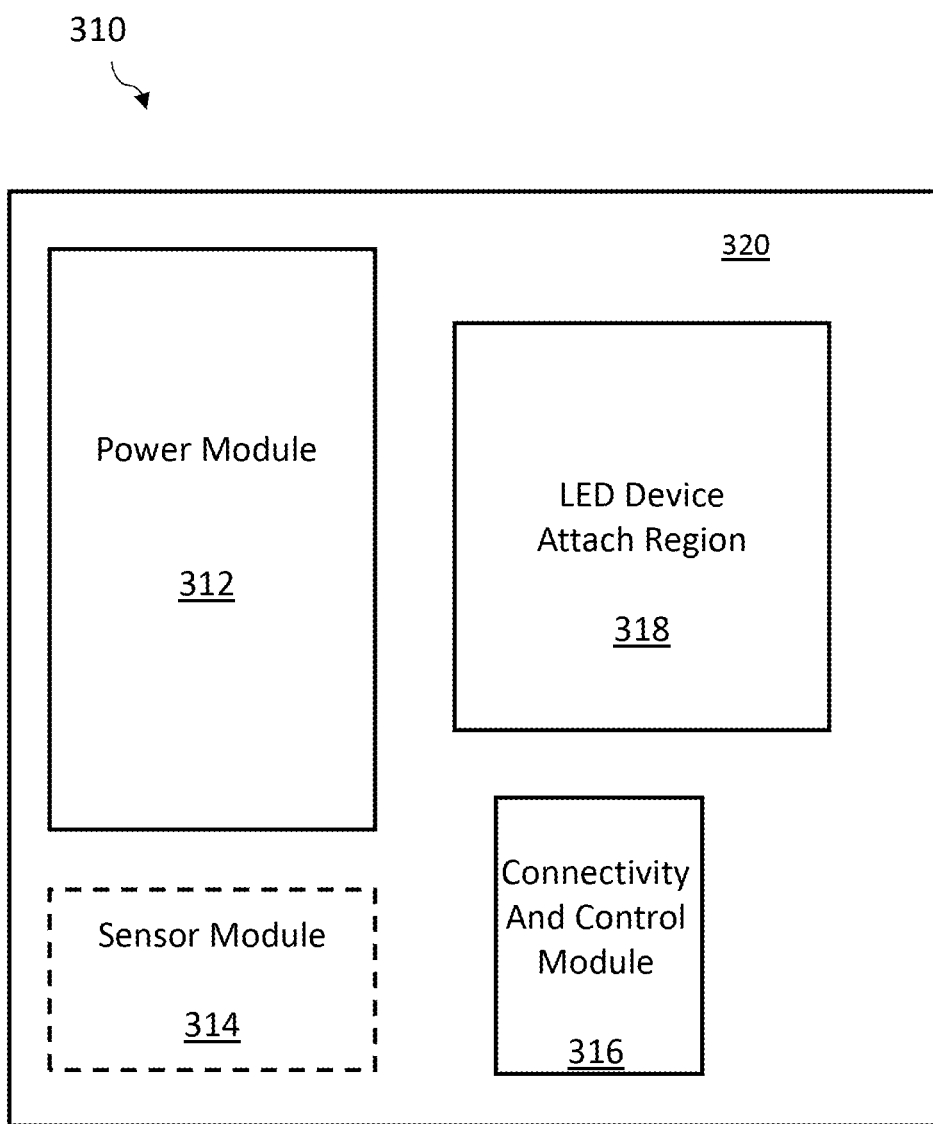
FIG. 3 is a top view of an electronics board for an integrated LED lighting system according to one embodiment.

FIG. 3 is a top view of an electronics board 310 for an integrated LED lighting system according to one embodiment. In alternative embodiments, two or more electronics boards may be used for the LED lighting system. For example, the LED array may be on a separate electronics board, or the sensor module may be on a separate electronics board. In the illustrated example, the electronics board 310 includes a power module 312, a sensor module 314, a connectivity and control module 316 and an LED attach region 318 reserved for attachment of an LED array to a substrate 320.

The substrate 320 may be any board capable of mechanically supporting, and providing electrical coupling to, electrical components, electronic components and/or electronic modules using conductive connecters, such as tracks, traces, pads, vias, and/or wires. The power module 312 may include electrical and/or electronic elements. In an example embodiment, the power module 312 includes an AC/DC conversion circuit, a DC/DC conversion circuit, a dimming circuit, and an LED driver circuit.

The sensor module 314 may include sensors needed for an application in which the LED array is to be implemented.

The connectivity and control module 316 may include the system microcontroller and any type of wired or wireless module configured to receive a control input from an external device.

The term module, as used herein, may refer to electrical and/or electronic components disposed on individual circuit boards that may be soldered to one or more electronics boards 310. The term module may, however, also refer to electrical and/or electronic components that provide similar functionality, but which may be individually soldered to one or more circuit boards in a same region or in different regions.

Figure 4A:
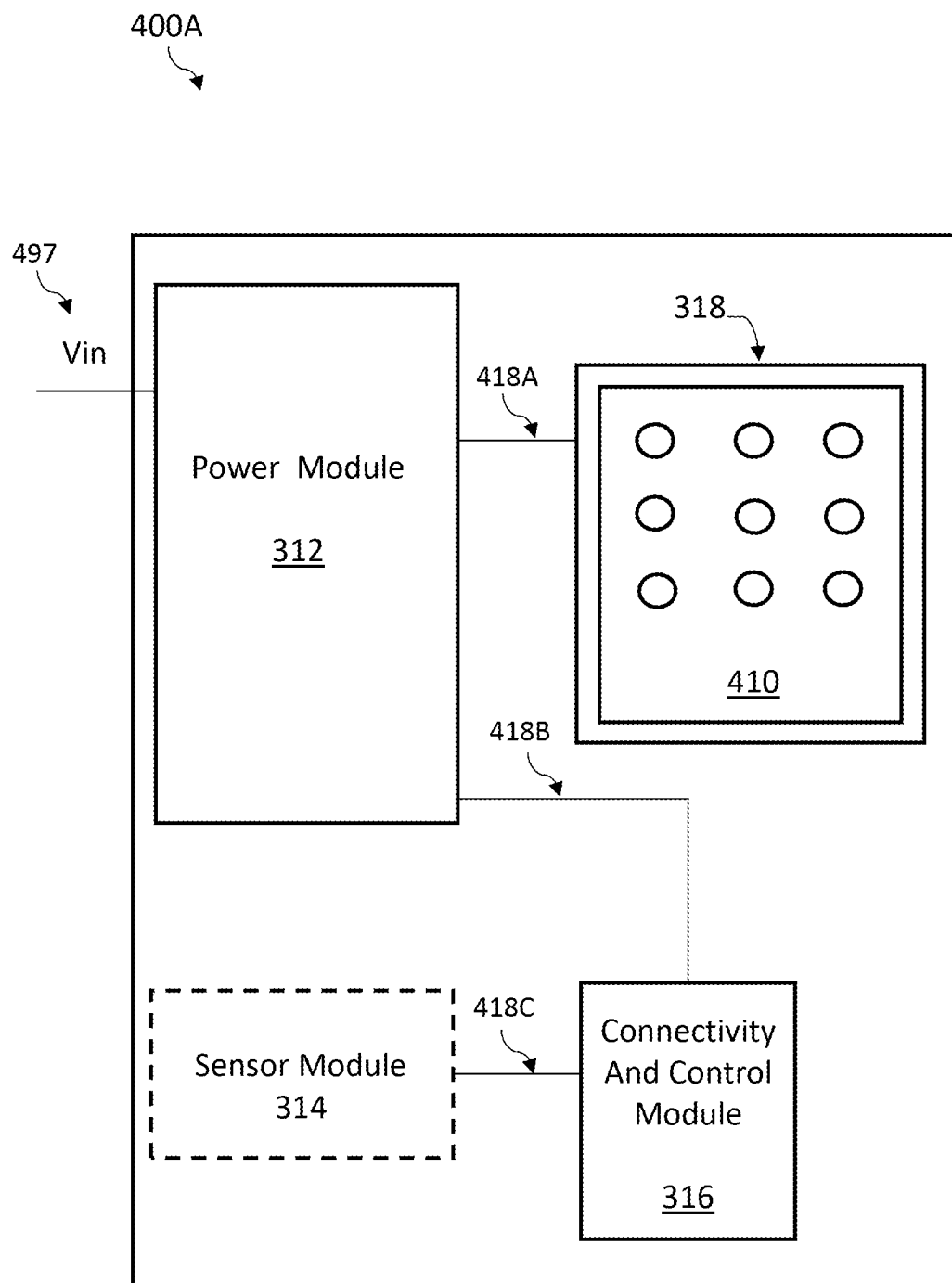
FIG. 4A is a top view of the electronics board with LED array attached to the substrate at the LED device attach region in one embodiment.

FIG. 4A is a top view of the electronics board 310 with an LED array 410 attached to the substrate 320 at the LED device attach region 318 in one embodiment. The electronics board 310 together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 4A, the connectivity and control module 316 receives sensor signals from the sensor module 314 over trace 418C.

Figure 4B:
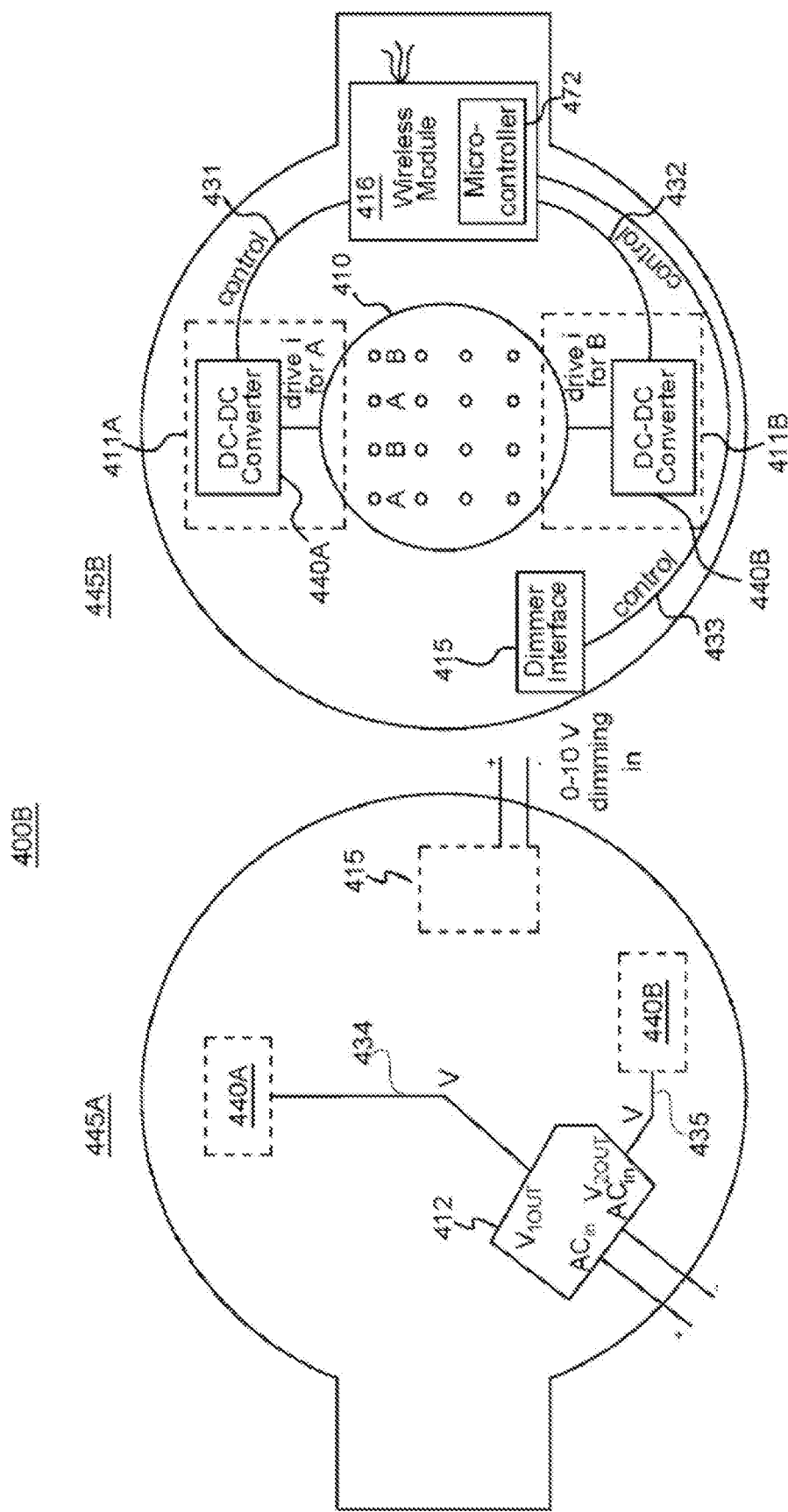
FIG. 4B is a diagram of one embodiment of a two channel integrated LED lighting system with electronic components mounted on two surfaces of a circuit board.

FIG. 4B illustrates one embodiment of a two channel integrated LED lighting system with electronic components mounted on two surfaces of a circuit board 499. As shown in FIG. 4B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 4B does not include a sensor module (as described in FIG. 3 and FIG. 4A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 5:
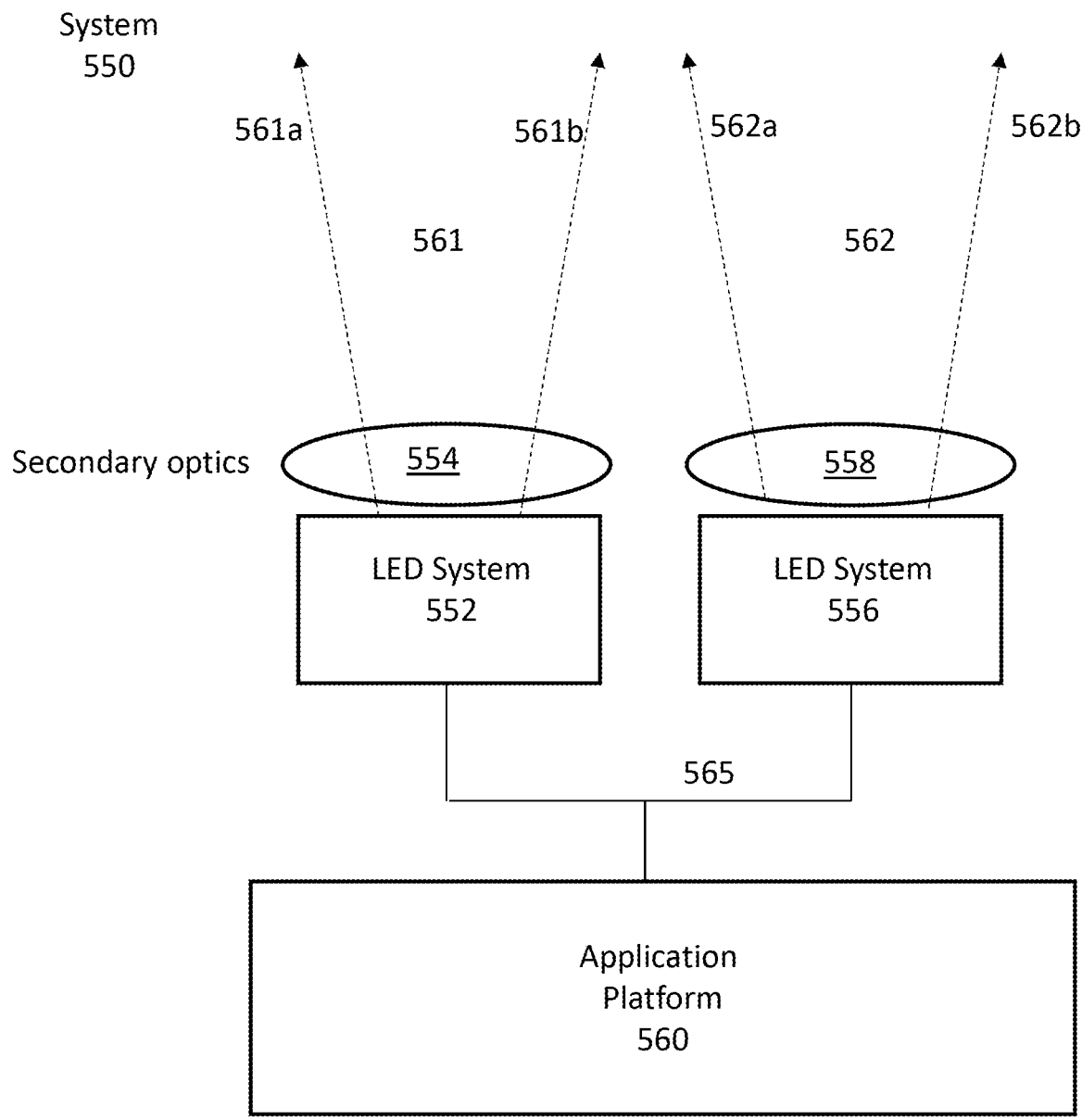
FIG. 5 is a diagram of an example application system.

FIG. 5 shows an example system 550 which includes an application platform 560, LED systems 552 and 556, and secondary optics 554 and 558. The LED System 552 produces light beams 561 shown between arrows 561a and 561b. The LED System 556 may produce light beams 562 between arrows 562a and 562b. In the embodiment shown in FIG. 5, the light emitted from LED system 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The integrated LED lighting system shown in FIG. 3, LED System 400A shown in FIG. 4A, illustrate LED systems 552 and 556 in example embodiments.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 4A and LED System 400B shown in FIG. 4B illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light emitting diode (LED) array comprising:
a first pixel adjacent to a second pixel, the second pixel adjacent to a third pixel;

the first pixel comprising a first stack and having a first pair of contacts, the first pair of contacts comprising at least one first contact on a first pixel semiconductor layer, the first pixel semiconductor layer on a first pixel tunnel junction, the first pixel tunnel junction on a first pixel LED on a substrate;

the second pixel comprising a second stack and having a second pair of contacts, the second pair of contacts comprising at least one second contact on a second pixel semiconductor layer, the second pixel semiconductor layer on a second pixel second tunnel junction, the second pixel tunnel junction on a second pixel second LED, the second pixel second LED on a second pixel first tunnel junction, the second pixel first tunnel junction on a second pixel first LED on the substrate;

the third pixel comprising a third stack and having a third pair of contacts, the third paid of contact comprising at least one third contact on a third pixel third LED, the third pixel third LED on a third pixel second tunnel junction, the third pixel second tunnel junction on a third pixel second LED, the third pixel second LED on a third pixel first tunnel junction, the third pixel first tunnel junction on a third pixel first LED on the substrate;

a first trench separating the first pixel and the second pixel;

a second trench separating the third pixel and the second pixel; and a dielectric layer formed over at least a portion of the first pixel, the second pixel, and the third pixel.

2. The LED array of claim 1, wherein the first pair of contacts are configured to receive a first voltage independent of the second pixel and the third pixel.

3. The LED array of claim 1, wherein the second pair of contacts are configured to receive a second voltage independent of the first pixel and the third pixel.

4. The LED array of claim 1, wherein the third pair contacts are configured to receive a third voltage independent of the first pixel and the second pixel.

5. The LED array of claim 1, wherein the first pixel is configured to emit a light of a first wavelength, the second pixel is configured to emit a light of a second wavelength, and the third pixel is configured to emit a light of a third wavelength.

6. The LED array of claim 1, wherein at least a portion of the dielectric layer is conformal.

7. The LED array of claim 1, wherein the first pair of contacts and the second pair of contacts comprises contacts to n-type semiconductor, a first contact of the third pair of contacts comprises a contact to n-type semiconductor and a second contact of the third pair of contacts comprises a contact to p-type semiconductor.

8. The LED array of claim 5, wherein the first wavelength is the shortest wavelength, the third wavelength is the longest wavelength, and the second wavelength is a wavelength between the first wavelength and the third wavelength.

9. The LED array of claim 1, further comprising a third pixel third tunnel junction on the third pixel third LED.

10. A system comprising:
the LED array of claim 1;
an LED device attach region having a first pair of electrodes coupled to the first pair of contacts on the first pixel, a second pair of electrodes coupled to the second pair of contacts on the second pixel, and a third pair of electrodes coupled to the third pair of contacts on the third pixel; and driver circuitry configured to provide independent voltages to one or more of the first pair of electrodes, the second pair of electrodes, and the third pair of electrodes.

11. The system of claim 10, wherein the first pixel is configured to emit a light having a first wavelength, the second pixel is configured to emit a light having a second wavelength, and the third pixel is configured to emit a light having a third wavelength.

12. The system of claim 10, wherein the electronic system is selected from the group consisting of a LED-based luminaire, a light emitting strip, a light emitting sheet, an optical display, and a microLED display.

13. The system of claim 10, further comprising:
a VLC receiver configured to convert a received light into data signals, the VLC receiver comprising an amplification circuit, an optical filter and concentrator, a photodiode, and a clock and data recovery (CDR) unit.

14. The system of claim 13, wherein the photodiode comprises one or more of the first pixel, the second pixel, and the third pixel.

15. The system of claim 11, wherein the first wavelength is the shortest wavelength, the third wavelength is the longest wavelength, and the second wavelength is a wavelength between the first wavelength and the third wavelength.

16. A method comprising:
receiving transmission data;
converting the transmission data into a plurality of driving modulation signals;
providing a first voltage to first a pixel of a light emitting diode (LED) array, based on the plurality of driving modulation signals, the first pixel comprising a first stack and having a first pair of contacts, the first pair of contacts comprising at least one first contact on a first pixel semiconductor layer on a first pixel tunnel junction, the first pixel tunnel junction on a first pixel LED on the substrate;
providing a second voltage to a second pixel of the LED array based on the plurality of driving modulation signals, the first pixel and the second pixel separated by a first trench extending to a substrate, the second pixel comprising a second stack having a second pair of contacts, the second pair of contacts comprising at least one second contact on a second pixel semiconductor layer on a second pixel second tunnel junction, the second pixel tunnel junction on a second pixel second LED, the second pixel second LED on a second pixel first tunnel junction, the second pixel first tunnel junction on a second pixel first LED on the substrate; and
providing a third voltage to a third pixel of the LED array based on the plurality of driving modulation signals, the third pixel comprising a third stack having a third pair of contacts, the third pair of contact comprising at least one third contact on a third pixel third LED on a third pixel second tunnel junction, the third pixel second tunnel junction on a third pixel second LED, the third pixel second LED on a third pixel first tunnel junction, the third pixel first tunnel junction on a third pixel first LED on the substrate.

17. The method of claim 16, wherein the first voltage, the second voltage, and the third voltage are independent from one another.

18. The method of claim 16, wherein the first voltage causes the first pixel to emit a light of a first wavelength, the second voltage causes the second pixel to emit a light of a second wavelength, and the third voltage causes the third pixel to emit light of a third wavelength.

19. The method of claim 18, wherein one or more of the light of the first wavelength, the light of the second wavelength, and the light of the third wavelength travel through the substrate, and wherein the first wavelength is the shortest wavelength, the third wavelength is the longest wavelength, and the second wavelength is a wavelength between the first wavelength and the third wavelength.

20. The method of claim 16, wherein the first pair of contacts and the second pair of contacts comprises contacts to n-type semiconductor, a first contact of the third pair of contacts comprises a contact to n-type semiconductor and a second contact of the third pair of contacts comprises a contact to p-type semiconductor.

* * * * *